(12) United States Patent
Kyogoku et al.

(10) Patent No.: US 11,043,586 B2
(45) Date of Patent: Jun. 22, 2021

(54) SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

(71) Applicant: KABUSHIKI KAISHA TOSHIBA, Minato-ku (JP)

(72) Inventors: Shinya Kyogoku, Yokohama (JP); Ryosuke Iijima, Setagaya (JP); Shinichi Kimoto, Tsukuba (JP); Katsuhisa Tanaka, Tsukuba (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/797,643

(22) Filed: Feb. 21, 2020

(65) Prior Publication Data

US 2021/0083101 A1 Mar. 18, 2021

(30) Foreign Application Priority Data

Sep. 13, 2019 (JP) .............................. JP2019-167648

(51) Int. Cl.
*H01L 29/78* (2006.01)
*H01L 21/04* (2006.01)
(Continued)

(52) U.S. Cl.
CPC ........ *H01L 29/7813* (2013.01); *H01L 21/047* (2013.01); *H01L 29/1608* (2013.01); *H01L 29/66068* (2013.01)

(58) Field of Classification Search
CPC ............... H01L 21/047; H01L 29/7813; H01L 29/1608; H01L 29/66068
(Continued)

(56) References Cited

U.S. PATENT DOCUMENTS 10,062,750 B2 8/2018 Kobayashi et al.
10,186,610 B2 1/2019 Kobayashi et al.
(Continued)

FOREIGN PATENT DOCUMENTS

JP 6090805 B2 3/2017
JP 2018-22852 A 2/2018
(Continued)

OTHER PUBLICATIONS

Hidefumi Takaya, et al., "A 4H-SiC Trench MOSFET with Thick Bottom Oxide for Improving Characteristics", Proceedings of The 25th International Symposium on Power Semiconductor Devices & ICs, Kanazawa, 2013, pp. 43-46.

*Primary Examiner* — Igwe U Anya
(74) *Attorney, Agent, or Firm* — Oblon, McClelland, Maier & Neustadt, L.L.P.

(57) ABSTRACT

A semiconductor device according to an embodiment includes: a SiC layer having a first plane and a second plane facing the first plane, the SiC layer including a first trench on a first plane side, an n-type first SiC region, a p-type second SiC region, an n-type third SiC region located in this order from the second plane to the first plane, a p-type fourth SiC region between the first SiC region and the first trench, a fifth SiC region between the first SiC region and the first plane, and a sixth SiC region between the fourth SiC region and the fifth SiC region, and the sixth SiC region having an n-type impurity concentration higher than an n-type impurity concentration of the first SiC region; a gate electrode in the first trench; a first electrode on the first plane side; and a second electrode on a second plane side.

14 Claims, 32 Drawing Sheets

(51) Int. Cl.
*H01L 29/66* (2006.01)
*H01L 29/16* (2006.01)

(58) Field of Classification Search
USPC .......................................................... 257/77
See application file for complete search history.

(56) References Cited

U.S. PATENT DOCUMENTS

| | | | |
|---|---|---|---|
| 2003/0042538 A1* | 3/2003 | Kumar | ............... H01L 29/66068 |
| | | | 257/328 |
| 2013/0306983 A1* | 11/2013 | Nakano | ................ H01L 29/0696 |
| | | | 257/76 |
| 2018/0025910 A1* | 1/2018 | Ohashi | ................ H01L 29/1095 |
| 2018/0308975 A1 | 10/2018 | Ohse et al. | |

FOREIGN PATENT DOCUMENTS

| JP | 2018-107167 A | 7/2018 |
|---|---|---|
| JP | 2018-182235 A | 11/2018 |

\* cited by examiner

SEMICONDUCTOR DEVICE, METHOD FOR MANUFACTURING SEMICONDUCTOR DEVICE, INVERTER CIRCUIT, DRIVE DEVICE, VEHICLE, AND ELEVATOR

CROSS-REFERENCE TO RELATED APPLICATION

This application is based upon and claims the benefit of priority from Japanese Patent Application No. 2019-167648, filed on Sep. 13, 2019, the entire contents of which are incorporated herein by reference.

FIELD

Embodiments described herein relate generally to a semiconductor device, a method for manufacturing a semiconductor device, an inverter circuit, a drive device, a vehicle, and an elevator.

BACKGROUND

Silicon carbide (SiC) is expected as a material for next-generation semiconductor devices. As compared with silicon, the silicon carbide has superior physical properties such as an approximately threefold band gap, approximately tenfold breakdown field strength, and approximately threefold thermal conductivity. By using these physical properties, a semiconductor device in which low loss and a high-temperature operation are enabled can be realized.

In a vertical metal oxide semiconductor field effect transistor (MOSFET), in order to realize low on-resistance, a trench gate structure in which a gate electrode is provided in a trench is applied. By adopting the trench gate structure, a channel area per unit area is increased and the on-resistance is reduced. From the viewpoint of reducing power consumption of the MOSFET, it is preferable to reduce a leak current (hereinafter, also referred to as an off-leak current) when the MOSFET is turned off.

DETAILED DESCRIPTION

Figure 1:
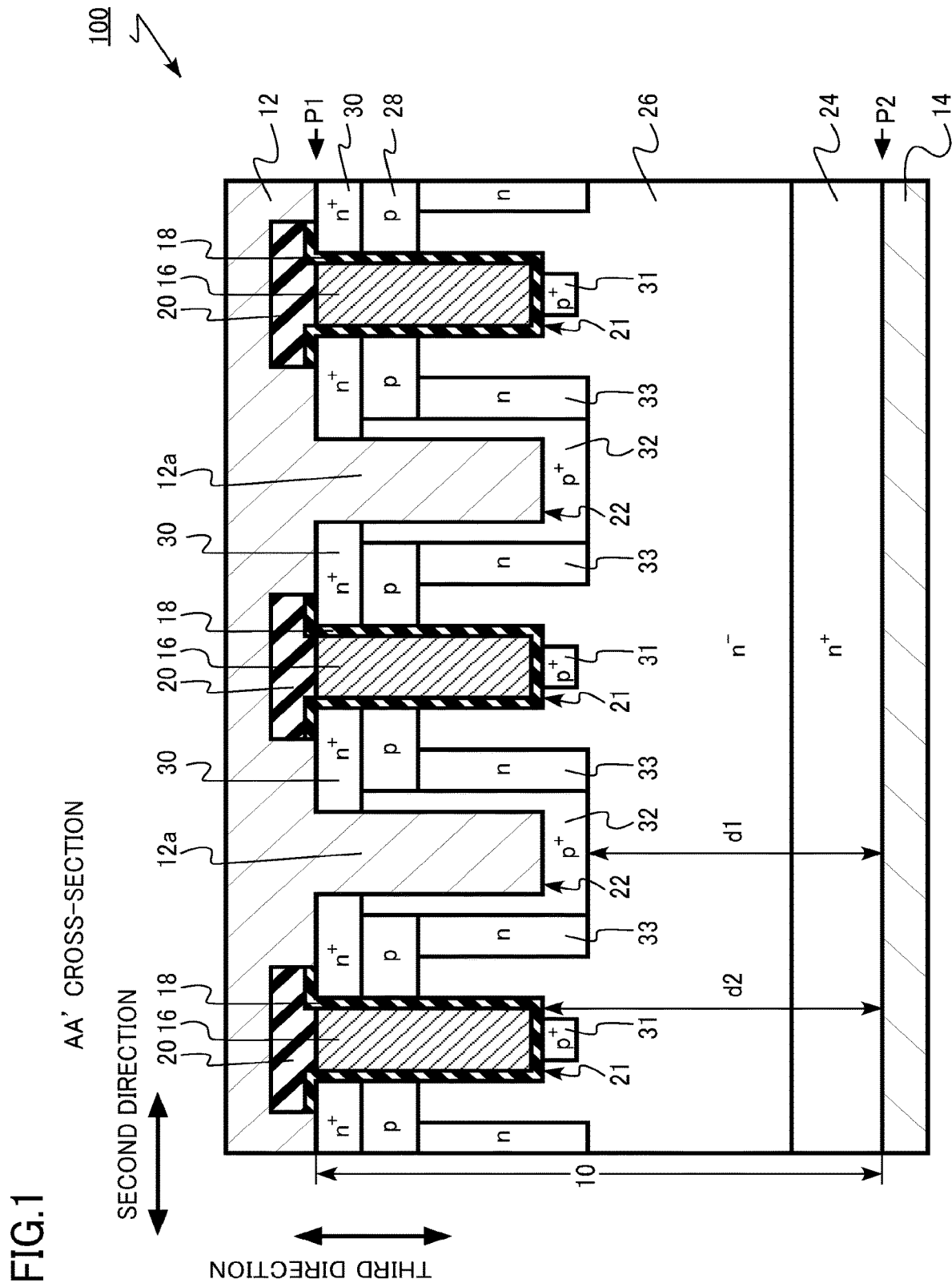
FIG. 1 is a schematic cross-sectional view of a semiconductor device according to a first embodiment.

A semiconductor device according to an embodiment includes: a silicon carbide layer having a first plane parallel to a first direction and a second direction orthogonal to the first direction, and a second plane facing the first plane, the silicon carbide layer including a first trench located on a side of the first plane, the first trench extending in the first direction, a first silicon carbide region of n-type, a second silicon carbide region of p-type located between the first silicon carbide region and the first plane, a third silicon carbide region of n-type located between the second silicon carbide region and the first plane, a fourth silicon carbide region of p-type located between the first silicon carbide region and the first trench, the fourth silicon carbide region having a p-type impurity concentration higher than a p-type impurity concentration of the second silicon carbide region, a fifth silicon carbide region of p-type located between the first silicon carbide region and the first plane, the fifth silicon carbide region having a distance from the second plane smaller than a distance between the second plane and the first trench, and the fifth silicon carbide region having a p-type impurity concentration higher than the p-type impurity concentration of the second silicon carbide region, and a sixth silicon carbide region of n-type located between the fourth silicon carbide region and the fifth silicon carbide region, the first silicon carbide region being interposed between the sixth silicon carbide region the fourth silicon carbide region, and the sixth silicon carbide region having an n-type impurity concentration higher than an n-type impurity concentration of the first silicon carbide region; a gate electrode located in the first trench; a gate insulating layer located between the gate electrode and the silicon carbide layer; a first electrode located on the side of the first plane of the silicon carbide layer; and a second electrode located on a side of the second plane of the silicon carbide layer.

Hereinafter, embodiments of the present disclosure will be described with reference to the drawings. In the following description, the same or similar members are denoted by the same reference numerals and the description of the members described once is appropriately omitted.

Further, in the following description, when notations $n^+$, n, $n^-$, $p^+$, p, and $p^-$ are used, these notations represent the relative magnitudes of impurity concentrations in respective conductive types. That is, an n-type impurity concentration of $n^+$ is relatively higher than an n-type impurity concentration of n and an n-type impurity concentration of $n^-$ is relatively lower than the n-type impurity concentration of n. Further, a p-type impurity concentration of $p^+$ is relatively higher than a p-type impurity concentration of p and a p-type impurity concentration of $p^-$ is relatively lower than the p-type impurity concentration of p. The $n^+$ type and the $n^-$ type may be simply described as the n types and the $p^+$ type and the $p^-$ type may be simply described as the p types.

The impurity concentration can be measured by secondary ion mass spectrometry (SIMS), for example. Further, the relative magnitude of the impurity concentration can be determined from the magnitude of a carrier concentration obtained by scanning capacitance microscopy (SCM), for example. Further, a distance such as a width and a depth of an impurity region can be obtained by SIMS, for example. Further, the distance such as the width and the depth of the impurity region can be obtained from an SCM image, for example.

A depth of a trench, a thickness of an insulating layer, and the like can be measured on a transmission electron microscope (TEM) image, for example. Further, the depth of the trench, the thickness of the insulating layer, and the like can be determined from a profile of SIMS, for example.

In the present specification, a "p-type impurity concentration" of a p-type silicon carbide region means a net p-type impurity concentration obtained by subtracting an n-type impurity concentration of the p-type silicon carbide region from the p-type impurity concentration of the p-type silicon carbide region. Further, an "n-type impurity concentration" of an n-type silicon carbide region means a net n-type impurity concentration obtained by subtracting a p-type impurity concentration of the n-type silicon carbide region from the n-type impurity concentration of the n-type silicon carbide region.

(First Embodiment)

A semiconductor device according to a first embodiment includes: a silicon carbide layer having a first plane parallel to a first direction and a second direction orthogonal to the first direction, and a second plane facing the first plane, the silicon carbide layer including a first trench located on a side of the first plane, the first trench extending in the first direction, a first silicon carbide region of n-type, a second silicon carbide region of p-type located between the first silicon carbide region and the first plane, a third silicon carbide region of n-type located between the second silicon carbide region and the first plane, a fourth silicon carbide region of p-type located between the first silicon carbide region and the first trench, the fourth silicon carbide region having a p-type impurity concentration higher than a p-type impurity concentration of the second silicon carbide region, a fifth silicon carbide region of p-type located between the first silicon carbide region and the first plane, the fifth silicon carbide region having a distance from the second plane smaller than a distance between the second plane and the first trench, and the fifth silicon carbide region having a p-type impurity concentration higher than the p-type impurity concentration of the second silicon carbide region, and a sixth silicon carbide region of n-type located between the fourth silicon carbide region and the fifth silicon carbide region, the first silicon carbide region being interposed between the sixth silicon carbide region the fourth silicon carbide region, and the sixth silicon carbide region having an n-type impurity concentration higher than an n-type impurity concentration of the first silicon carbide region; a gate electrode located in the first trench; a gate insulating layer located between the gate electrode and the silicon carbide layer; a first electrode located on the side of the first plane of the silicon carbide layer; and a second electrode located on a side of the second plane of the silicon carbide layer.

The semiconductor device according to the first embodiment is a vertical MOSFET 100 using silicon carbide. The MOSFET 100 is a MOSFET having a trench gate structure in which a gate electrode is provided in a trench. Further, the MOSFET 100 is a MOSFET having so-called double trench structure in which a source electrode is provided in a trench. Further, the MOSFET 100 is an n-channel MOSFET using electrons as carriers.

Figure 2:
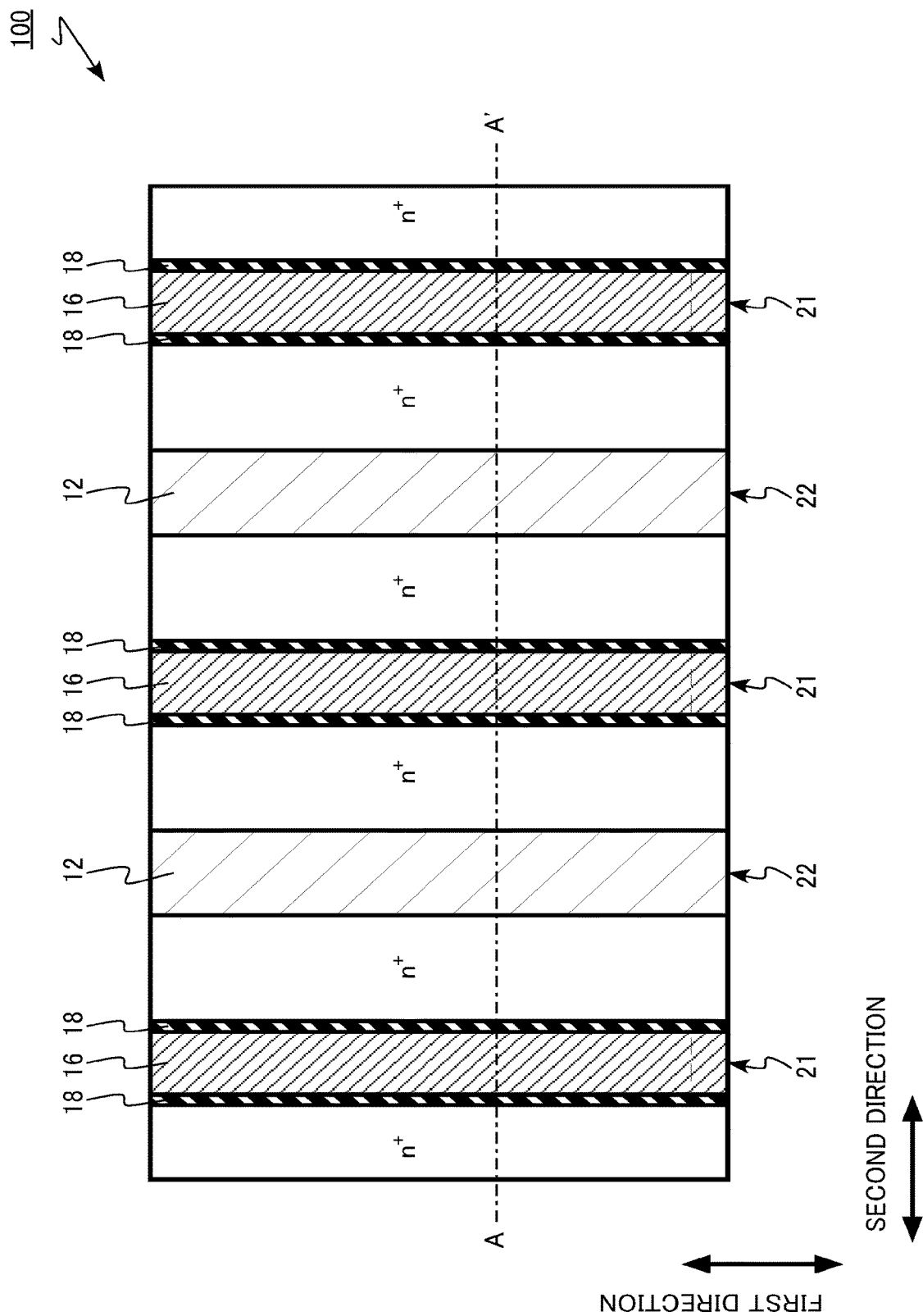
FIG. 2 is a schematic plan view of the semiconductor device according to the first embodiment.

FIG. 1 is a schematic cross-sectional view of the semiconductor device according to the first embodiment. FIG. 2 is a schematic plan view of the semiconductor device according to the first embodiment.

FIG. 1 is a cross-sectional view taken along the line AA' of FIG. 2. FIG. 2 shows a pattern on a first plane P1 of FIG. 1.

The MOSFET 100 includes a silicon carbide layer 10, a source electrode 12 (first electrode), a drain electrode 14 (second electrode), a gate electrode 16, a gate insulating layer 18, and an interlayer insulating layer 20. The source electrode 12 has a contact region 12a.

The silicon carbide layer 10 has a gate trench 21 (first trench), a contact trench 22 (second trench), an $n^+$-type drain region 24, $n^-$-type drift region 26 (first silicon carbide region), a p-type body region 28 (second silicon carbide region), an n+-type source region 30 (third silicon carbide region), a p+-type gate trench bottom region 31 (fourth silicon carbide region), a p+-type field relaxation region 32 (fifth silicon carbide region), and an n-type high concentration region 33 (sixth silicon carbide region).

The silicon carbide layer 10 is located between the source electrode 12 and the drain electrode 14. The silicon carbide layer 10 includes a first plane ("P1" in FIG. 1) and a second plane ("P2" in FIG. 1). Hereinafter, the first plane P1 is also referred to as a face and the second plane P2 is also referred to as a back face. The second plane P2 faces the first plane P1.

A first direction and a second direction are directions parallel to the first plane P1. Further, the second direction is a direction orthogonal to the first direction. Further, a third direction is a direction perpendicular to the first plane. The third direction is a direction perpendicular to the first direction and the second direction.

Hereinafter, a "depth" means a depth based on the first plane P1.

The silicon carbide layer 10 is single crystal SiC. The silicon carbide layer 10 is, for example, 4H—SiC. A thickness of the silicon carbide layer 10 is, for example, 5 µm or more and 500 µm or less.

The first plane P1 is, for example, a plane inclined by 0° or more and 8° or less with respect to a (0001) face. That is, the first plane is a plane in which a normal is inclined by 0° or more and 8° or less with respect to a c axis in a [0001] direction. In other words, an off angle with respect to the (0001) face is 0° or more and 8° or less. Further, the second plane P2 is, for example, a plane inclined by 0° or more and 8° or less with respect to a (000-1) face.

The (0001) face is referred to as a silicon face. The (000-1) face is referred to as a carbon face. An inclination direction of each of the first plane P1 and the second plane P2 is, for example, a [11-20] direction. The [11-20] direction is an a-axis direction. In FIGS. 1 and 2, for example, the second direction shown in the drawings is the a-axis direction.

The gate trench 21 exists in the silicon carbide layer 10. The gate trench 21 is located on the side of the first plane P1 of the silicon carbide layer 10. The gate trench 21 is a groove formed in the silicon carbide layer 10.

The gate trench 21 extends in the first direction as shown in FIG. 2. The gate trench 21 has a stripe shape as shown in FIG. 2.

The gate trenches 21 are repeatedly disposed in the second direction as shown in FIGS. 1 and 2. The depth of the gate trench 21 is, for example, 1 µm or more and 2 µm or less. The width of the gate trench 21 in the second direction is, for example, 0.5 µm or more and 1 µm or less.

The gate trench 21 penetrates the source region 30 and the body region 28.

The contact trench 22 exists in the silicon carbide layer 10. The contact trench 22 is located on the side of the first plane P1 of the silicon carbide layer 10. The contact trench 22 is a groove formed in the silicon carbide layer 10.

The contact trench 22 extends in the first direction as shown in FIG. 2. The contact trench 22 has a stripe shape as shown in FIG. 2.

The contact trenches 22 are repeatedly disposed in the second direction as shown in FIGS. 1 and 2. The depth of the contact trench 22 is, for example, 1 µm or more and 2 µm or less. The width of the contact trench 22 in the second direction is, for example, 0.5 µm or more and 1 µm or less.

The contact trench 22 penetrates the source region 30 and the body region 28.

The contact trench 22 is provided between the two gate trenches 21. The width of the contact trench 22 in the second direction and the width of the gate trench 21 in the second direction are, for example, the same.

The depth of the contact trench 22 and the depth of the gate trench 21 are, for example, the same. In other words, a distance from the second plane P2 to the gate trench 21 and a distance from the second plane P2 to the contact trench 22 are the same.

The gate electrode 16 is located in the gate trench 21. The gate electrode 16 is provided between the source electrode 12 and the drain electrode 14. The gate electrode 16 extends in the first direction.

The gate electrode 16 is a conductive layer. The gate electrode 16 is, for example, polycrystalline silicon including p-type impurities or n-type impurities.

The gate insulating layer 18 is located between the gate electrode 16 and the silicon carbide layer 10. The gate insulating layer 18 is provided between the source region 30, the body region 28, and the drift region 26 and the gate electrode 16.

The gate insulating layer 18 is, for example, a silicon oxide film. As the gate insulating layer 18, for example, a high dielectric constant insulating film can be applied. Further, as the gate insulating layer 18, for example, a stacked film of a silicon oxide film and a high dielectric constant insulating film can be applied The interlayer insulating layer 20 is provided on the gate electrode 16. The interlayer insulating layer 20 is provided between the gate electrode 16 and the source electrode 12.

The thickness of the interlayer insulating layer 20 is larger than the thickness of the gate insulating layer 18, for example. The interlayer insulating layer 20 is, for example, a silicon oxide film. The interlayer insulating layer 20 electrically isolates the gate electrode 16 and the source electrode 12.

The source electrode 12 is located on the side of the first plane P1 of the silicon carbide layer 10. The source electrode 12 is provided on the first plane P1 of the silicon carbide layer 10. The source electrode 12 is in contact with the source region 30 and the field relaxation region 32.

The source electrode 12 is in contact with the source region 30 on the first plane P1 of the silicon carbide layer 10.

The contact region 12a to be a part of the source electrode 12 is located in the contact trench 22. The contact region 12a is in contact with the source region 30 on the side face of the contact trench 22. The contact region 12a is in contact with the field relaxation region 32 on the side face and the bottom face of the contact trench 22.

The source electrode 12 includes a metal. The metal forming the source electrode 12 has a stacked structure of titanium (Ti) and aluminum (Al), for example. The source electrode 12 may include metal silicide or metal carbide in contact with the silicon carbide layer 10, for example.

The drain electrode 14 is located on the side of the second plane P2 of the silicon carbide layer 10. The drain electrode 14 is provided on the second plane P2 of the silicon carbide layer 10. The drain electrode 14 is in contact with the drain region 24.

The drain electrode 14 is, for example, a metal or a metal semiconductor compound. The drain electrode 14 includes a material selected from the group consisting of nickel silicide (NiSi), titanium (Ti), nickel (Ni), silver (Ag), and gold (Au), for example.

The n+-type drain region 24 is provided on the side of the second plane P2 of the silicon carbide layer 10. The drain region 24 includes nitrogen (N) as n-type impurities, for example. An n-type impurity concentration of the drain region 24 is, for example, $1\times10^{18}$ cm$^{-3}$ or more and $1\times10^{21}$ cm$^{-3}$ or less.

The n−-type drift region 26 is provided on the drain region 24. The drift region 26 is located between the first plane P1 and the drain region 24.

The drift region 26 includes nitrogen (N) as n-type impurities, for example. An n-type impurity concentration of the drift region 26 is lower than the n-type impurity concentration of the drain region 24. The n-type impurity concentration of the drift region 26 is, for example, $4\times10^{14}$ cm$^{-3}$ or more and $1\times10^{18}$ cm$^{-3}$ or less.

The p-type body region 28 is located between the drift region 26 and the first plane P1. The body region 28 is located between the gate trench 21 and the contact trench 22.

The body region 28 functions as a channel formation region of the MOSFET 100. For example, when the MOSFET 100 is turned on, a channel through which electrons flow is formed in a region of the body region 28 in contact with the gate insulating layer 18. The region of the body region 28 in contact with the gate insulating layer 18 becomes the channel formation region.

The body region 28 includes aluminum (Al) as p-type impurities, for example. A p-type impurity concentration of the body region 28 is, for example, $5\times10^{16}$ cm$^{-3}$ or more and $5\times10^{17}$ cm$^{-3}$ or less.

The depth of the body region 28 is smaller than the depth of the gate trench 21. The depth of the body region 28 is, for example, 0.4 µm or more and 1.0 µm or less.

The thickness of the body region 28 in a depth direction (third direction) is, for example, 0.1 µm or more and 0.4 µm or less.

The n+-type source region 30 is located between the body region 28 and the first plane P1. The source region 30 is located between the gate trench 21 and the contact trench 22.

The source region 30 is in contact with the source electrode 12. The source region 30 is in contact with the gate insulating layer 18.

The source region 30 includes phosphorus (P) as n-type impurities, for example. An n-type impurity concentration of the source region 30 is higher than the n-type impurity concentration of the drift region 26. The n-type impurity concentration of the source region 30 is, for example, $1\times10^{19}$ cm$^{-3}$ or more and $1\times10^{21}$ cm$^{-3}$ or less.

The depth of the source region 30 is smaller than the depth of the body region 28. The depth of the source region 30 is, for example, 0.1 µm or more and 0.4 µm or less.

The p+-type gate trench bottom region 31 is located between the drift region 26 and the gate trench 21. The gate trench bottom region 31 is provided at the bottom of the gate trench 21. The gate trench bottom region 31 is in contact with the gate insulating layer 18.

The gate trench bottom region 31 has a function of alleviating a field applied to the gate insulating layer 18 when the MOSFET 100 is turned off. The gate trench bottom region 31 is fixed at the same potential as the source electrode 12, for example.

The gate trench bottom region 31 includes aluminum (Al) as p-type impurities, for example. A p-type impurity concentration of the gate trench bottom region 31 is higher than the p-type impurity concentration of the body region 28, for example. The p-type impurity concentration of the gate trench bottom region 31 is, for example, ten times or more the p-type impurity concentration of the body region 28.

The p-type impurity concentration of the gate trench bottom region 31 is lower than the p-type impurity concentration of the field relaxation region 32, for example. The p-type impurity concentration of the gate trench bottom region 31 is, for example, $5\times10^{17}$ cm$^{-3}$ or more and $5\times10^{19}$ cm$^{-3}$ or less.

The p+-type field relaxation region 32 is located between the contact trench 22 and the drift region 26. The field relaxation region 32 is in contact with the bottom face of the contact trench 22. The field relaxation region 32 is in contact with the contact region 12a of the source electrode 12.

The field relaxation region 32 is located between the contact trench 22 and the body region 28. The field relaxation region 32 is in contact with the side face of the contact trench 22.

A distance (d1 in FIG. 1) of the field relaxation region 32 from the second plane P2 is smaller than a distance (d2 in FIG. 1) between the second plane P2 and the gate trench 21, for example. In other words, the depth of the field relaxation region 32 is larger than the depth of the gate trench 21.

The field relaxation region 32 has a function of alleviating a field applied to the gate insulating layer 18 when the MOSFET 100 is turned off. The field relaxation region 32 is fixed at the same potential as the source electrode 12.

The field relaxation region 32 includes aluminum (Al) as p-type impurities, for example. A p-type impurity concentration of the field relaxation region 32 is higher than the p-type impurity concentration of the body region 28. The p-type impurity concentration of the field relaxation region 32 is, for example, ten times or more the p-type impurity concentration of the body region 28. The p-type impurity concentration of the field relaxation region 32 is, for example, $5\times10^{17}$ cm$^{-3}$ or more and $5\times10^{20}$ cm$^{-3}$ or less.

The n-type high concentration region 33 is located between the gate trench bottom region 31 and the field relaxation region 32. The drift region 26 is interposed between the high concentration region 33 and the gate trench bottom region 31. The high concentration region 33 and the gate trench bottom region 31 are separated from each other.

The n-type high concentration region 33 is in contact with the field relaxation region 32, for example. The n-type high concentration region 33 is in contact with the body region 28, for example. The high concentration region 33 is separated from the gate insulating layer 18, for example.

The depth of the n-type high concentration region 33 is larger than the depth of the gate trench bottom region 31, for example. The depth of the n-type high concentration region 33 is the same as the depth of the field relaxation region 32, for example. The depth of the n-type high concentration region 33 may be smaller than the depth of the field relaxation region 32, for example.

The high concentration region 33 has a function of suppressing the extension of a depletion layer extending from the field relaxation region 32 to the drift region 26 in a horizontal direction (second direction) when the MOSFET 100 is turned on, thereby reducing on-resistance.

The high concentration region 33 includes nitrogen (N) as n-type impurities, for example. An n-type impurity concentration of the high concentration region 33 is higher than the n-type impurity concentration of the drift region 26. The n-type impurity concentration of the high concentration region 33 is, for example, $1\times10^{16}$ cm$^{-3}$ or more and $1\times10^{18}$ cm$^{-3}$ or less.

The n-type impurity concentration of the high concentration region 33 is, for example, not less than twice and not more than 20 times the n-type impurity concentration of the drift region 26.

Next, an example of a method for manufacturing the semiconductor device according to the first embodiment will be described.

The method for manufacturing the semiconductor device according to the first embodiment includes: forming a first trench on the side of a first plane of a silicon carbide layer having the first plane, a second plane facing the first plane, and an n-type first region located between the second plane and the first plane; forming a second trench on the side of the first plane of the silicon carbide layer; ion-implanting a p-type impurity into the second trench in a direction inclined at a first angle with respect to a normal of the first plane and forming a p-type second region; ion-implanting an n-type impurity into the second trench in a direction inclined at a second angle with respect to the normal of the first plane and forming an n-type third region having an n-type impurity concentration higher than an n-type impurity concentration of the first region between the first region and the second region; forming a gate insulating layer in the first trench; and forming a gate electrode on the gate insulating layer in the first trench.

FIGS. 3 to 18 are schematic cross-sectional views showing an example of the method for manufacturing the semiconductor device according to the first embodiment. FIGS. 3 to 18 show cross-sections corresponding to FIG. 1.

Figure 3:
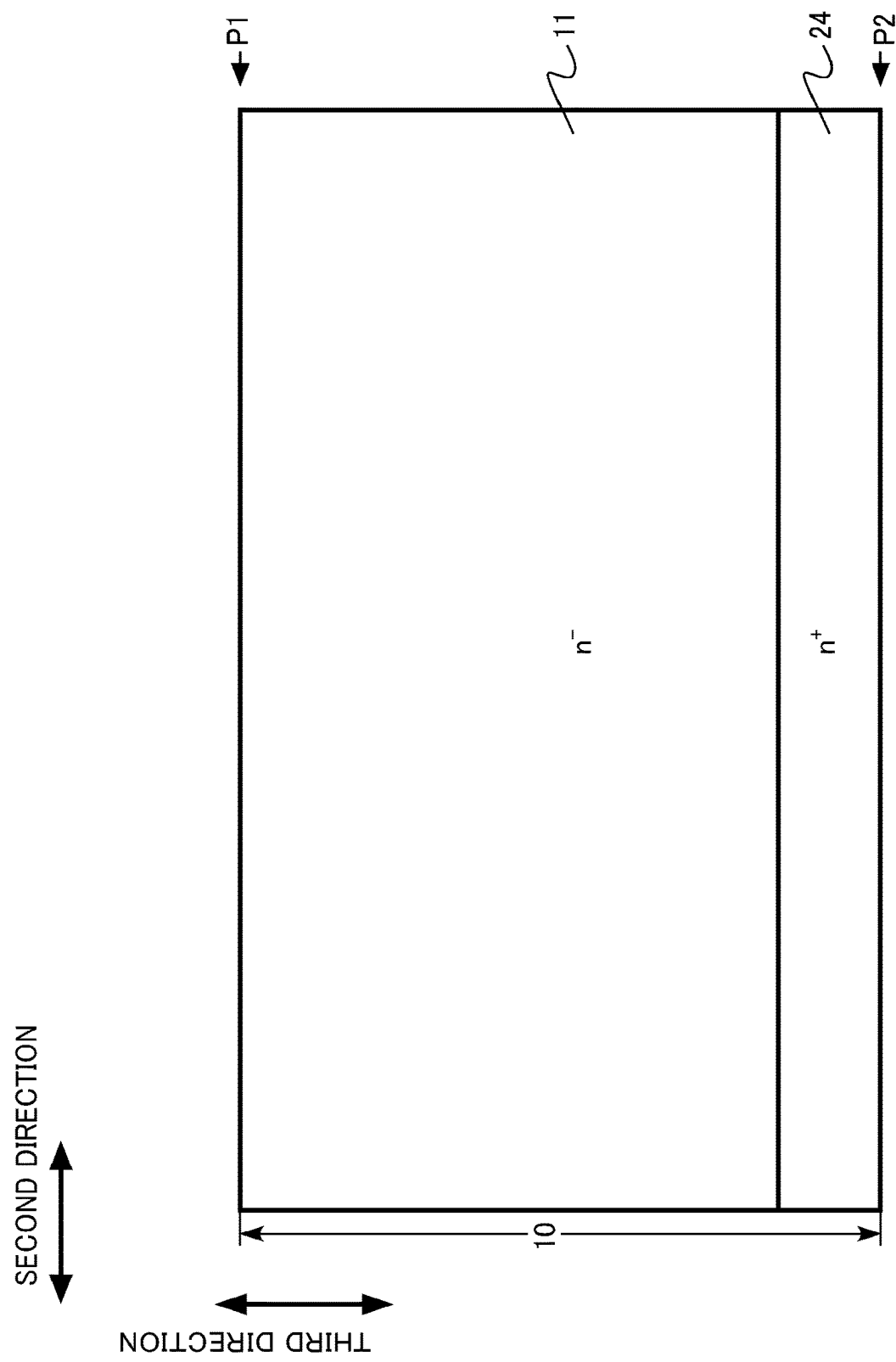
FIG. 3 is a schematic cross-sectional view showing an example of a method for manufacturing the semiconductor device according to the first embodiment.

First, the silicon carbide layer 10 having the n$^+$-type drain region 24 and an n$^-$-type epitaxial layer 11 formed on the drain region 24 by epitaxial growth is prepared (FIG. 3). A part of the epitaxial layer 11 finally becomes the drift region 26. The epitaxial layer 11 is an example of the first region.

The silicon carbide layer 10 includes the first plane ("P1" in FIG. 3) and the second plane ("P2" in FIG. 3). Hereinafter, the first plane P1 is also referred to as a face and the second plane P2 is also referred to as a back face.

Figure 4:
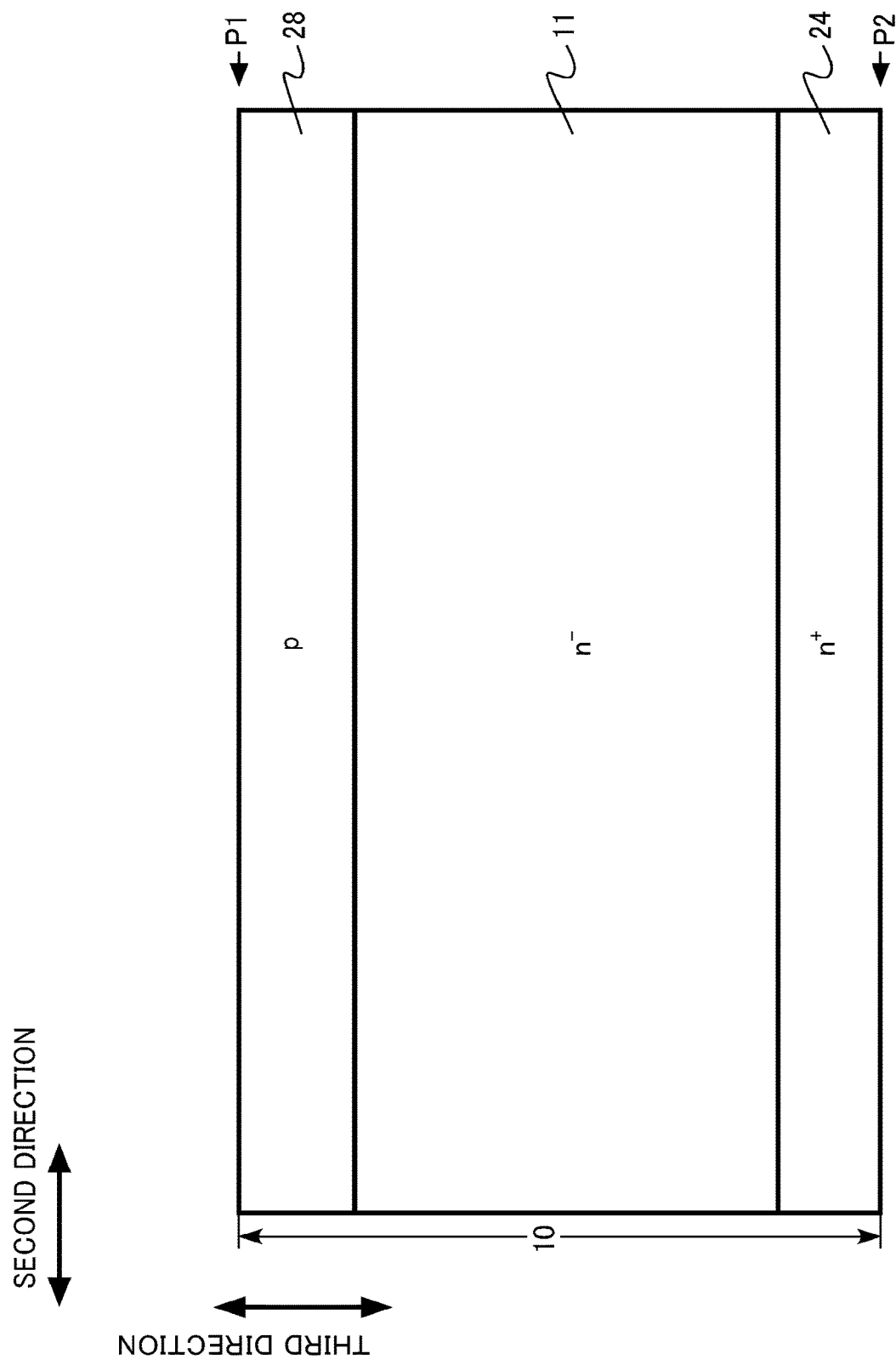
FIG. 4 is a schematic cross-sectional view showing an example of the method for manufacturing the semiconductor device according to the first embodiment.

Next, the p-type body region 28 is formed in the epitaxial layer 11 by an ion implantation method (FIG. 4).

Figure 5:
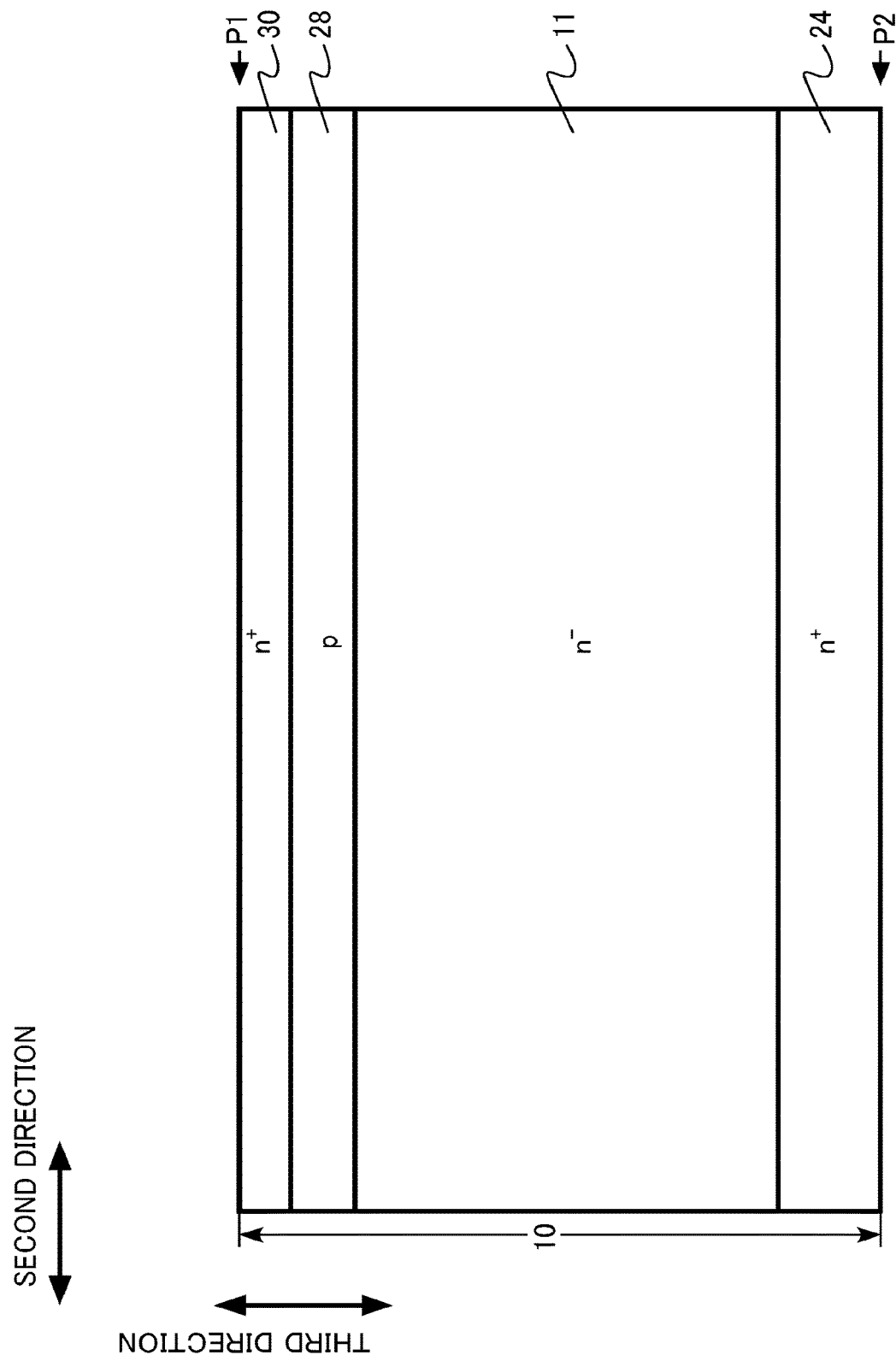
FIG. 5 is a schematic cross-sectional view showing an example of the method for manufacturing the semiconductor device according to the first embodiment.

Next, the n$^+$-type source region 30 is formed in the epitaxial layer 11 by the ion implantation method (FIG. 5). The source region 30 is formed between the body region 28 and the first plane P1.

Figure 6:
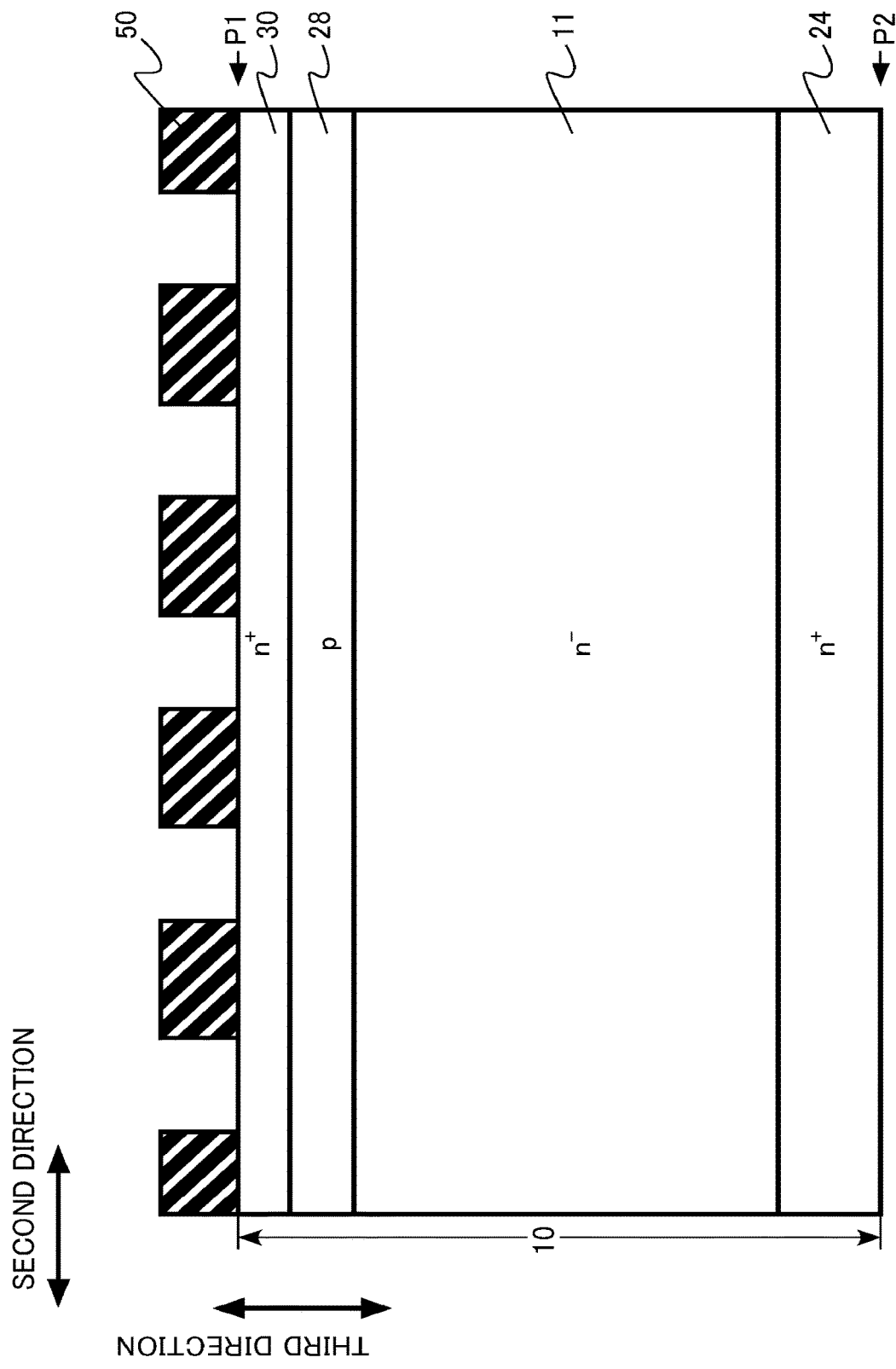
FIG. 6 is a schematic cross-sectional view showing an example of the method for manufacturing the semiconductor device according to the first embodiment.

Next, a mask material 50 is formed on the face of the silicon carbide layer 10 (FIG. 6). The mask material 50 is formed by, for example, depositing a film by a chemical vapor deposition method (CVD method), a lithography method, and patterning a film using a reactive ion etching method (RIE method). The mask material 50 is, for example, a silicon oxide film.

Figure 7:
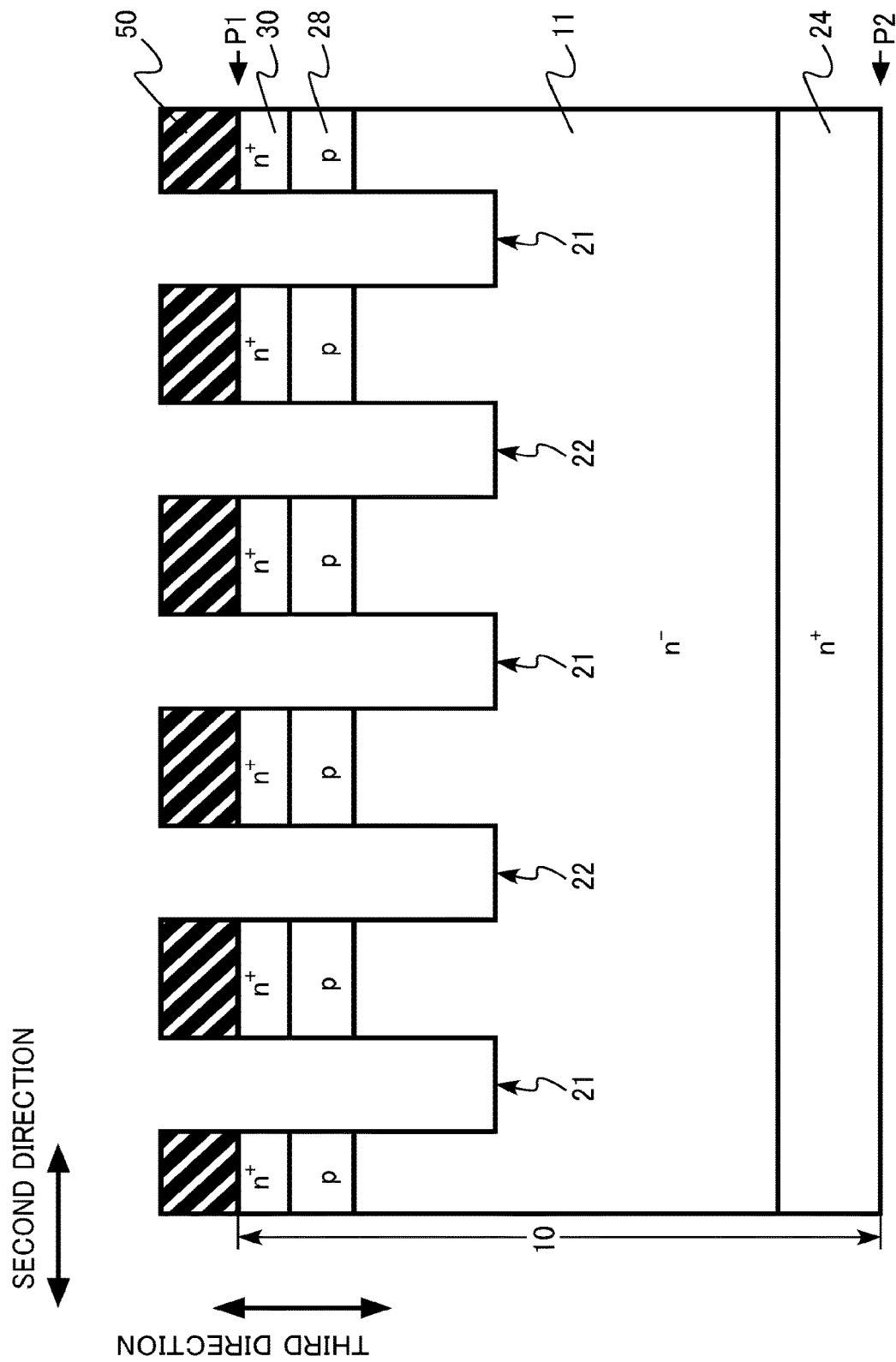
FIG. 7 is a schematic cross-sectional view showing an example of the method for manufacturing the semiconductor device according to the first embodiment.

Next, the gate trench 21 (first trench) and the contact trench 22 (second trench) are formed using the mask material 50 as a mask (FIG. 7). The gate trench 21 and the contact trench 22 are formed by using the RIE method. The gate trench 21 and the contact trench 22 are formed to penetrate the source region 30 and the body region 28.

Next, a mask material 51 is formed on the silicon carbide layer 10. The mask material 51 covers the contact trench 22. The mask material 51 is, for example, a photoresist.

Figure 8:
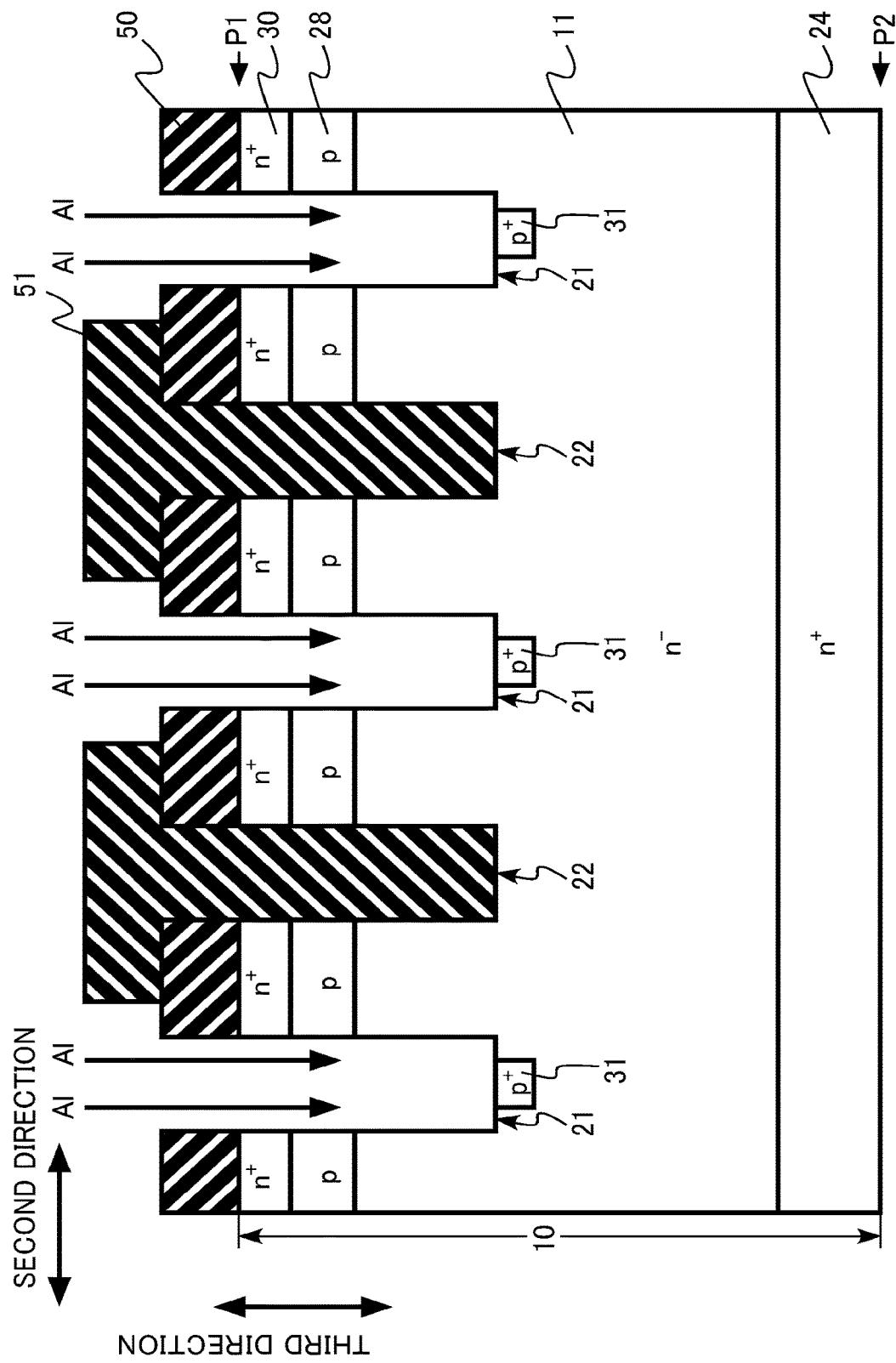
FIG. 8 is a schematic cross-sectional view showing an example of the method for manufacturing the semiconductor device according to the first embodiment.

Next, the p$^+$-type gate trench bottom region 31 is formed (FIG. 8). The gate trench bottom region 31 is formed by implanting p-type impurities into the gate trench 21 by the ion implantation method using the mask material 51 and the mask material 50 as a mask. The p-type impurity is, for example, an aluminum ion.

Figure 9:
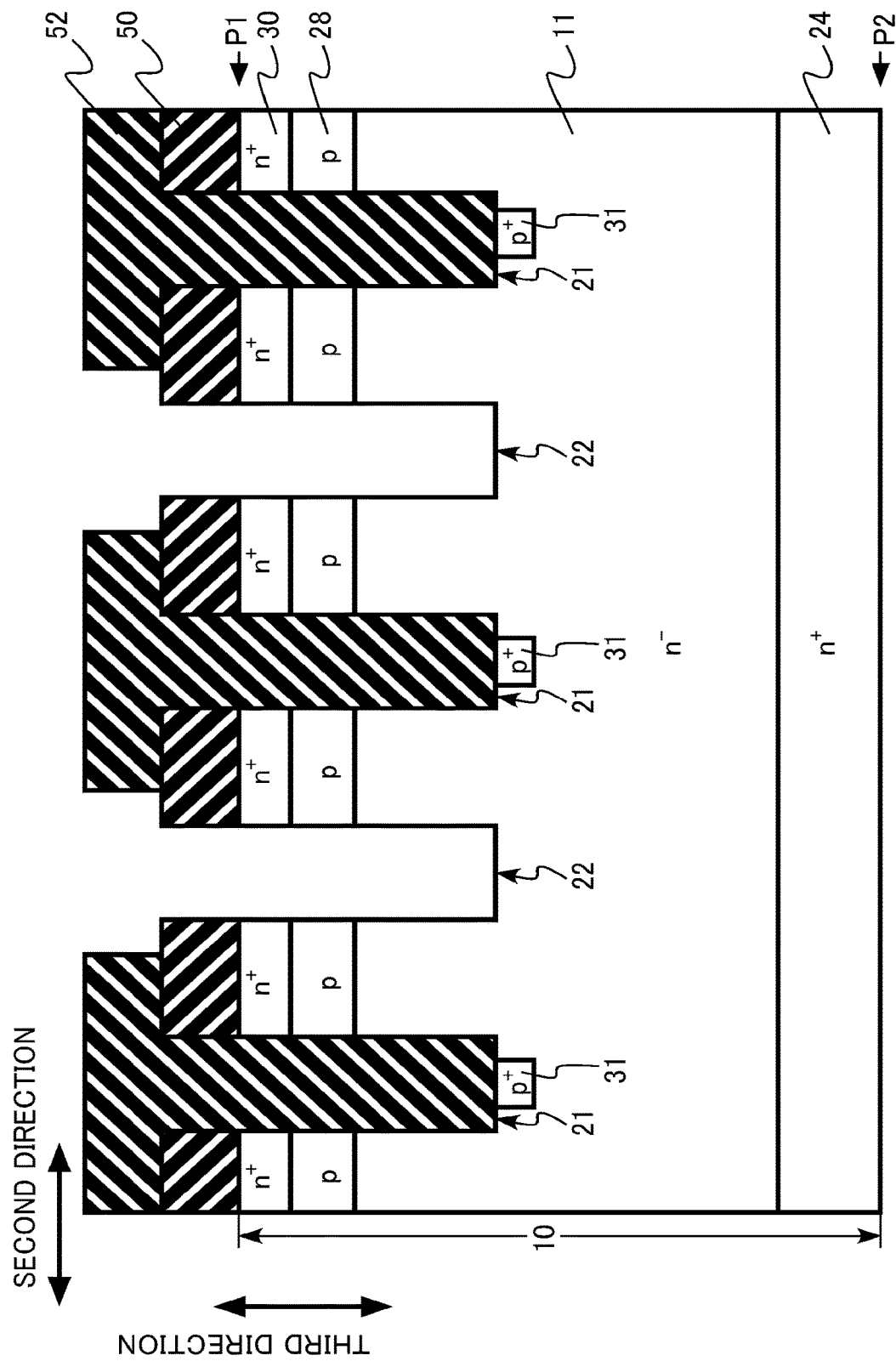
FIG. 9 is a schematic cross-sectional view showing an example of the method for manufacturing the semiconductor device according to the first embodiment.

Next, the mask material 51 is removed. Next, a mask material 52 is formed on the silicon carbide layer 10 (FIG. 9). The mask material 52 covers the gate trench 21. The mask material 52 is, for example, a photoresist.

Figure 10:
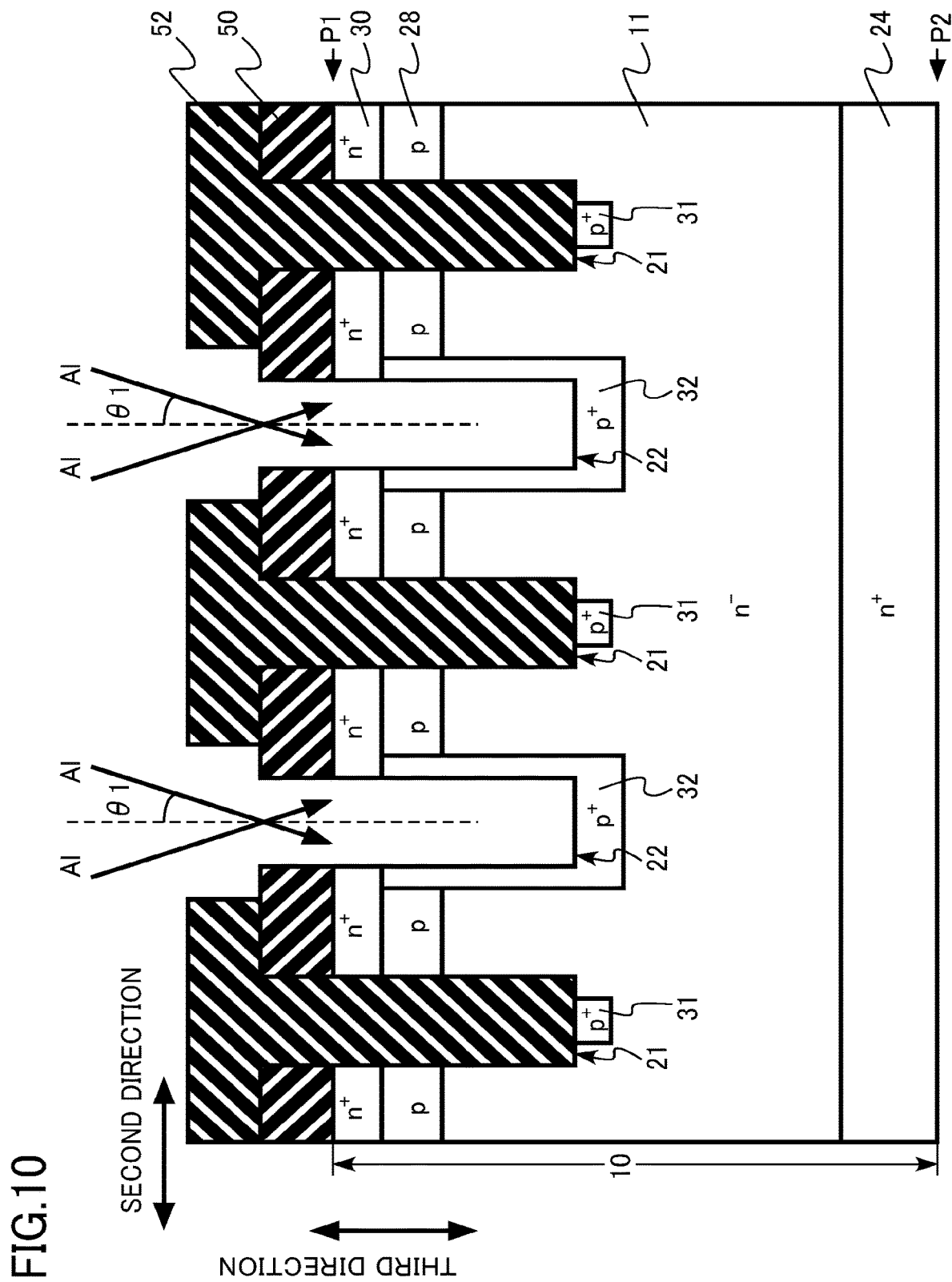
FIG. 10 is a schematic cross-sectional view showing an example of the method for manufacturing the semiconductor device according to the first embodiment.

Next, the p$^+$-type field relaxation region 32 is formed (FIG. 10). The field relaxation region 32 is an example of the second region.

The field relaxation region 32 is formed by implanting p-type impurities into the contact trench 22 by the oblique ion implantation method using the mask material 52 and the mask material 50 as a mask. The p-type impurity is, for example, an aluminum ion. The aluminum ion is implanted in a direction inclined at a first angle ($\theta 1$ in FIG. 10) with respect to a normal (dotted line in FIG. 10) of the first plane P1. The p$^+$-type field relaxation region 32 is formed in the vicinity of the side face and the bottom face of the contact trench 22 of the silicon carbide layer 10.

Figure 11:
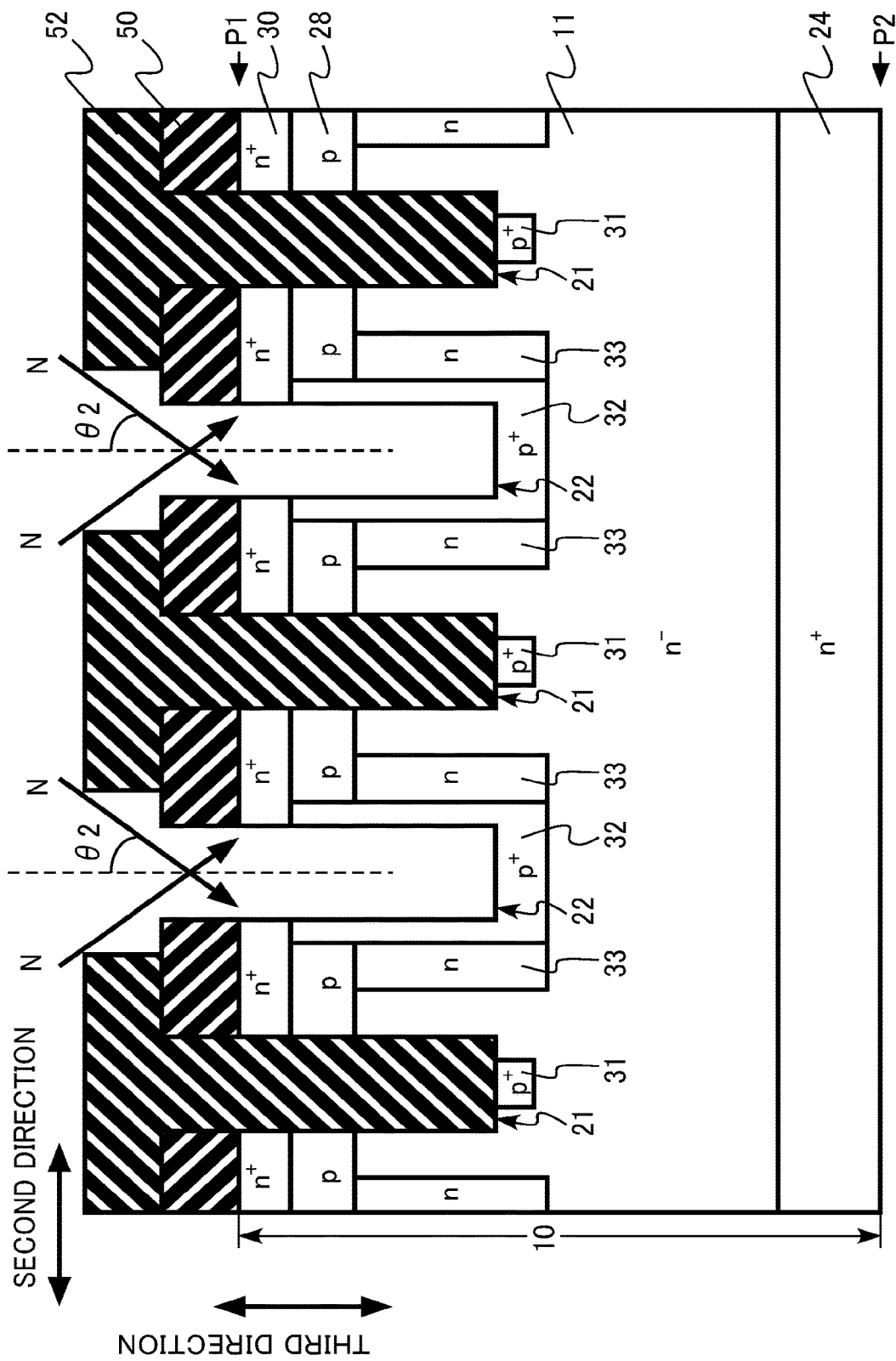
FIG. 11 is a schematic cross-sectional view showing an example of the method for manufacturing the semiconductor device according to the first embodiment.

Next, the n-type high concentration region 33 is formed (FIG. 11). The high concentration region 33 is an example of the third region. The high concentration region 33 is formed between the epitaxial layer 11 (first region) and the field relaxation region 32 (second region).

The high concentration region 33 is formed by implanting n-type impurities into the contact trench 22 by the oblique ion implantation method using the mask material 52 and the mask material 50 as a mask. The n-type impurity is, for example, a nitrogen ion. The nitrogen ion is implanted in a direction inclined at a second angle ($\theta 2$ in FIG. 11) with respect to a normal (dotted line in FIG. 11) of the first plane P1.

The second angle $\theta 2$ is larger than the first angle $\theta 1$, for example. In other words, the first angle $\theta 1$ is smaller than the second angle $\theta 2$, for example.

An accelerating voltage for ion implantation of the n-type impurity when the high concentration region 33 is formed is larger than an accelerating voltage for ion implantation for the p-type impurity when the field relaxation region 32 is formed, for example.

The n-type impurity concentration of the high concentration region 33 is higher than the n-type impurity concentration of the epitaxial layer 11.

Figure 12:
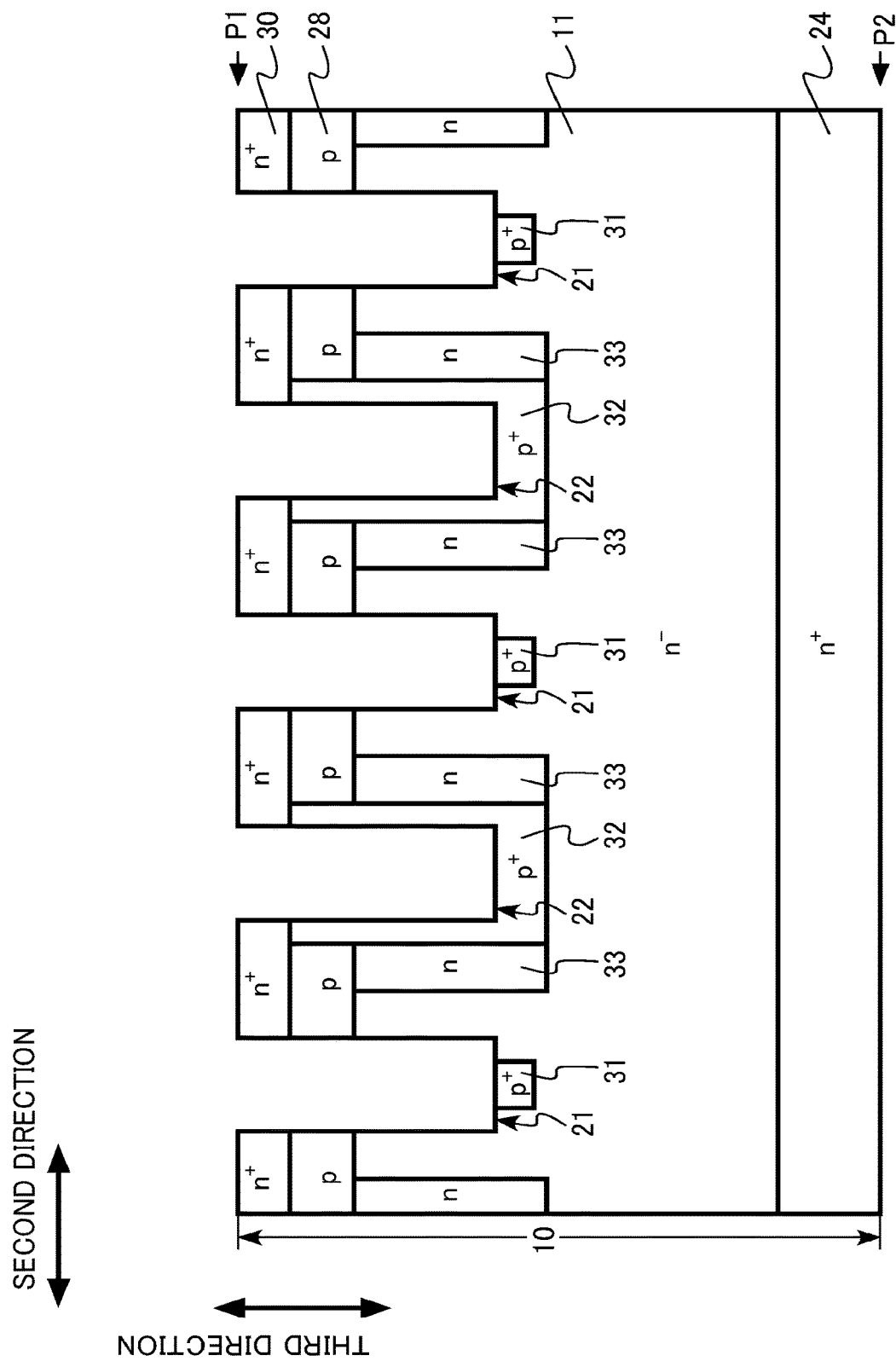
FIG. 12 is a schematic cross-sectional view showing an example of the method for manufacturing the semiconductor device according to the first embodiment.

Next, the mask material 52 and the mask material 50 are removed (FIG. 12). Next, activation annealing of the n-type impurity and the p-type impurity is performed.

Figure 13:
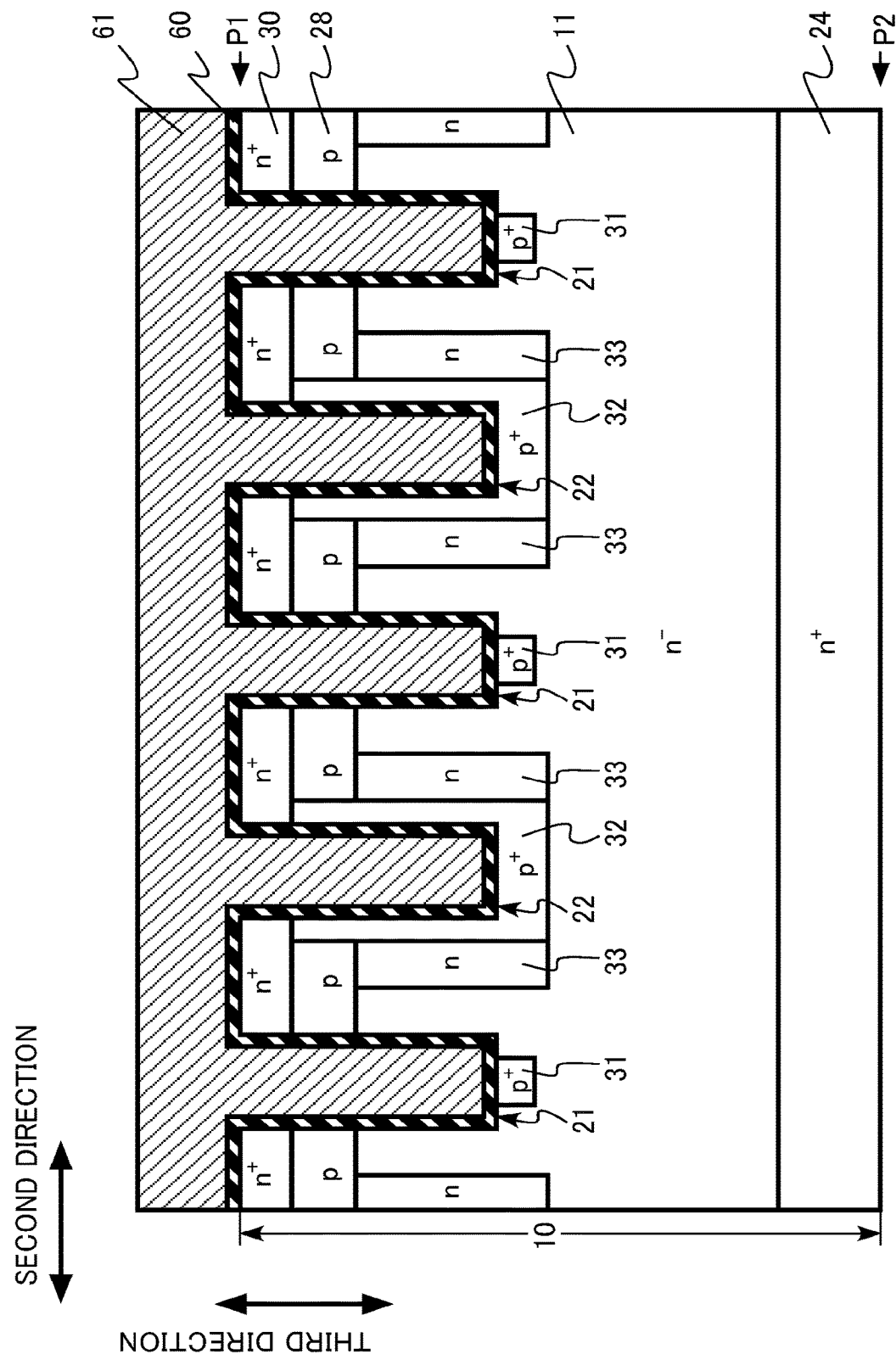
FIG. 13 is a schematic cross-sectional view showing an example of the method for manufacturing the semiconductor device according to the first embodiment.

Next, a first silicon oxide film 60 and a polycrystalline silicon film 61 are formed in the gate trench 21 and the contact trench 22 (FIG. 13).

The first silicon oxide film 60 and the polycrystalline silicon film 61 are formed by, for example, the CVD method. A part of the first silicon oxide film 60 becomes the gate insulating layer 18. A part of the polycrystalline silicon film 61 becomes the gate electrode 16.

Figure 14:
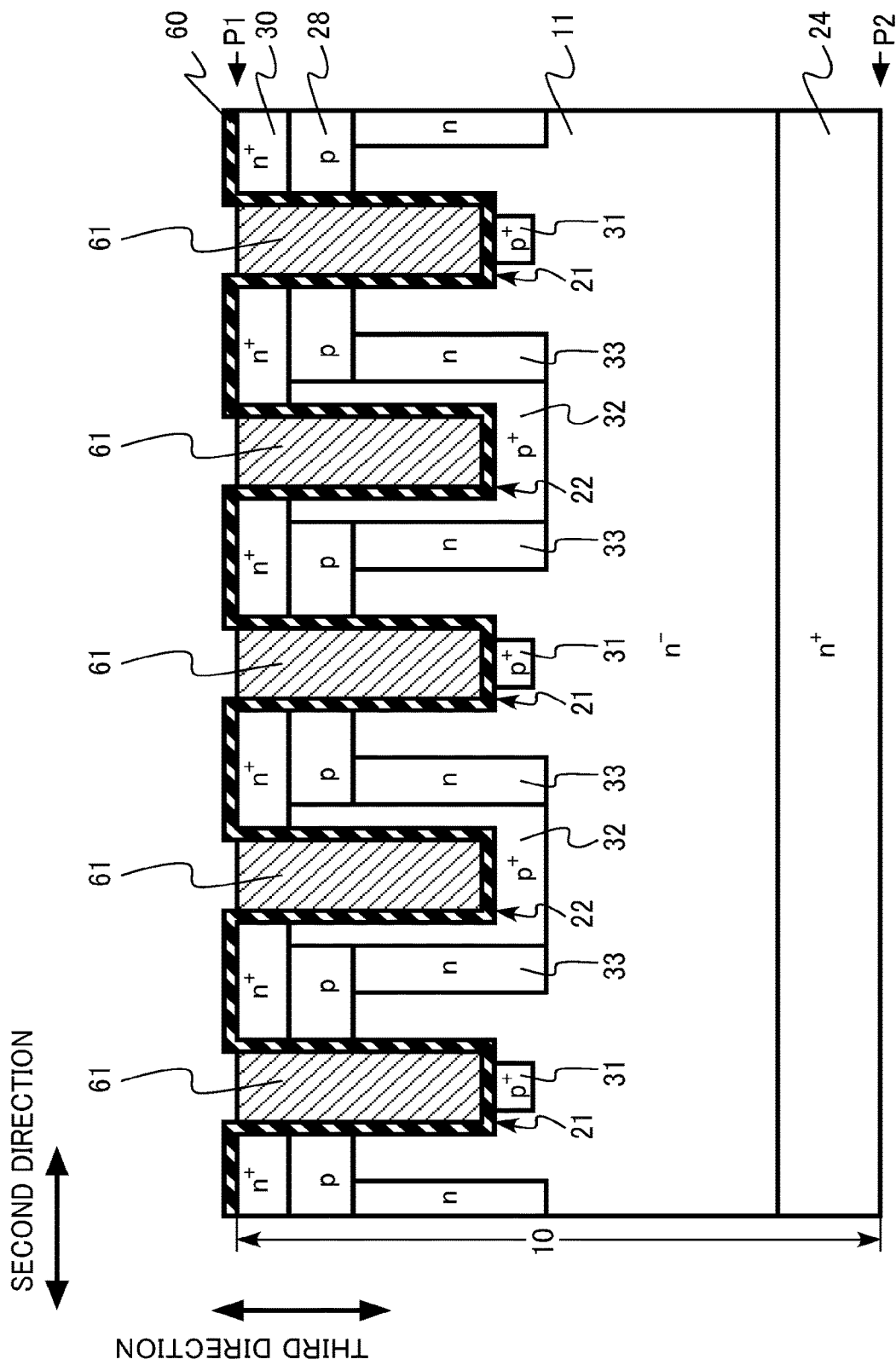
FIG. 14 is a schematic cross-sectional view showing an example of the method for manufacturing the semiconductor device according to the first embodiment.

Next, the polycrystalline silicon film 61 on the face of the silicon carbide layer 10 is removed (FIG. 14). The polycrystalline silicon film 61 on the face of the silicon carbide layer 10 is removed by, for example, a dry etching method. A part of the polycrystalline silicon film 61 remains in the gate trench 21 and the contact trench 22.

Next, a mask material 53 is formed on the face of the silicon carbide layer 10. The mask material 53 is, for example, a photoresist.

The mask material 53 covers the gate trench 21. The mask material 53 covers the polycrystalline silicon film 61 in the gate trench 21.

Figure 15:
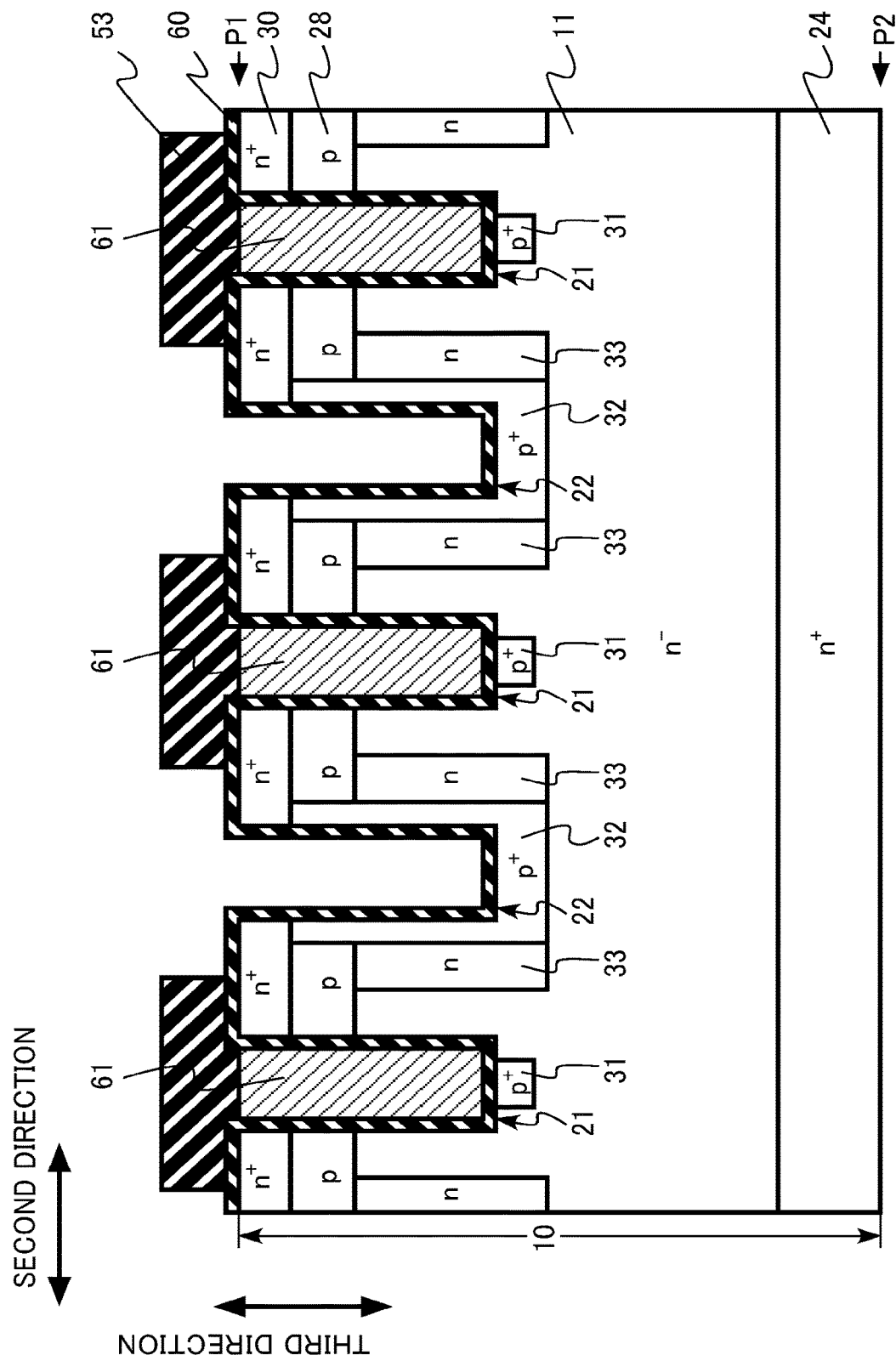
FIG. 15 is a schematic cross-sectional view showing an example of the method for manufacturing the semiconductor device according to the first embodiment.

Next, the polycrystalline silicon film 61 in the contact trench 22 is removed using the mask material 53 as a mask (FIG. 15). The polycrystalline silicon film 61 is removed by, for example, the dry etching method.

Figure 16:
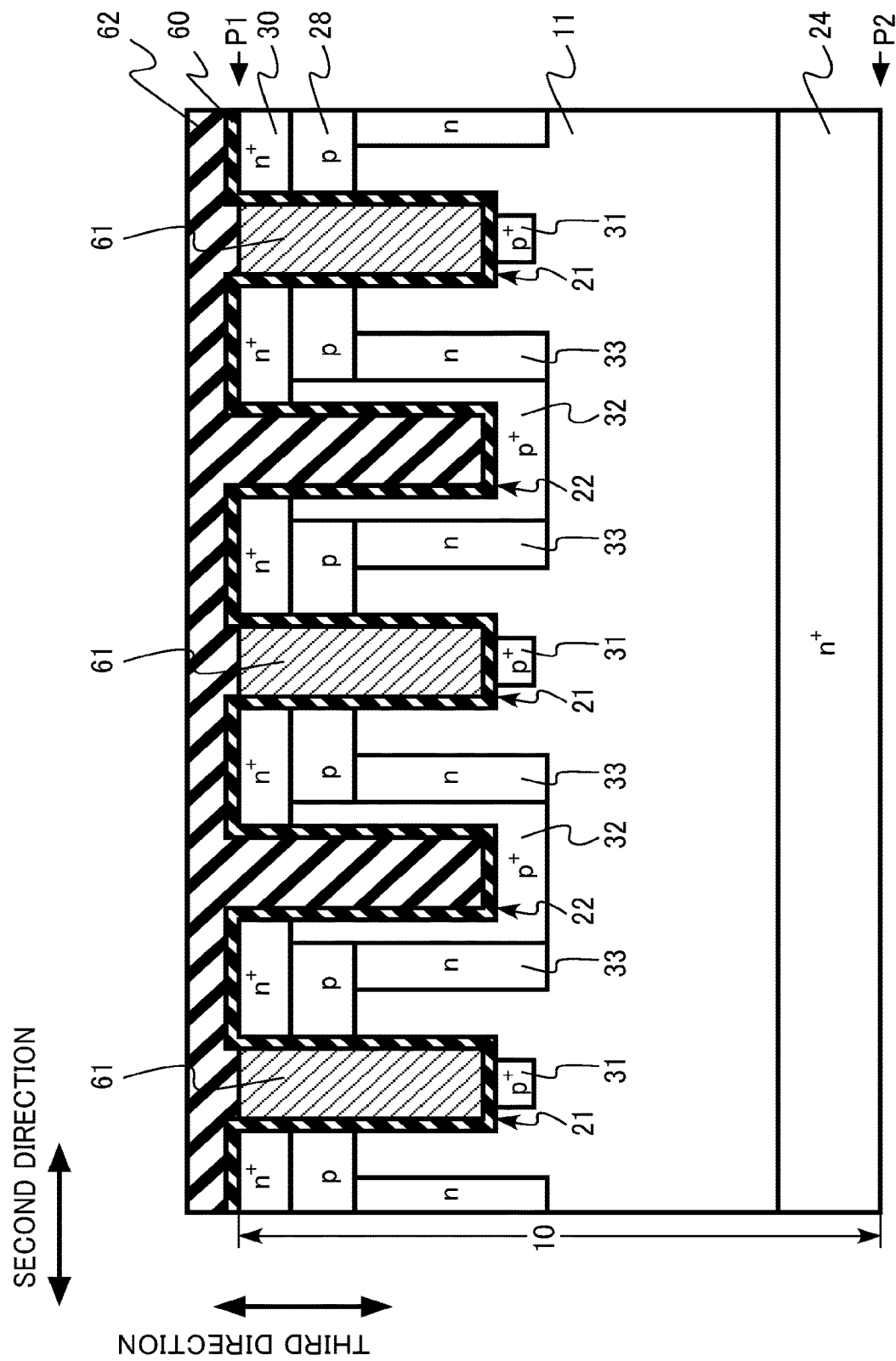
FIG. 16 is a schematic cross-sectional view showing an example of the method for manufacturing the semiconductor device according to the first embodiment.

Next, the mask material 53 is removed. Next, a second silicon oxide film 62 is formed on the first silicon oxide film 60 and the polycrystalline silicon film 61 (FIG. 16). The second silicon oxide film 62 is formed by, for example, the CVD method. A part of the second silicon oxide film 62 becomes the interlayer insulating layer 20.

Next, a mask material 54 is formed on the second silicon oxide film 62. The mask material 54 is, for example, a photoresist.

Figure 17:
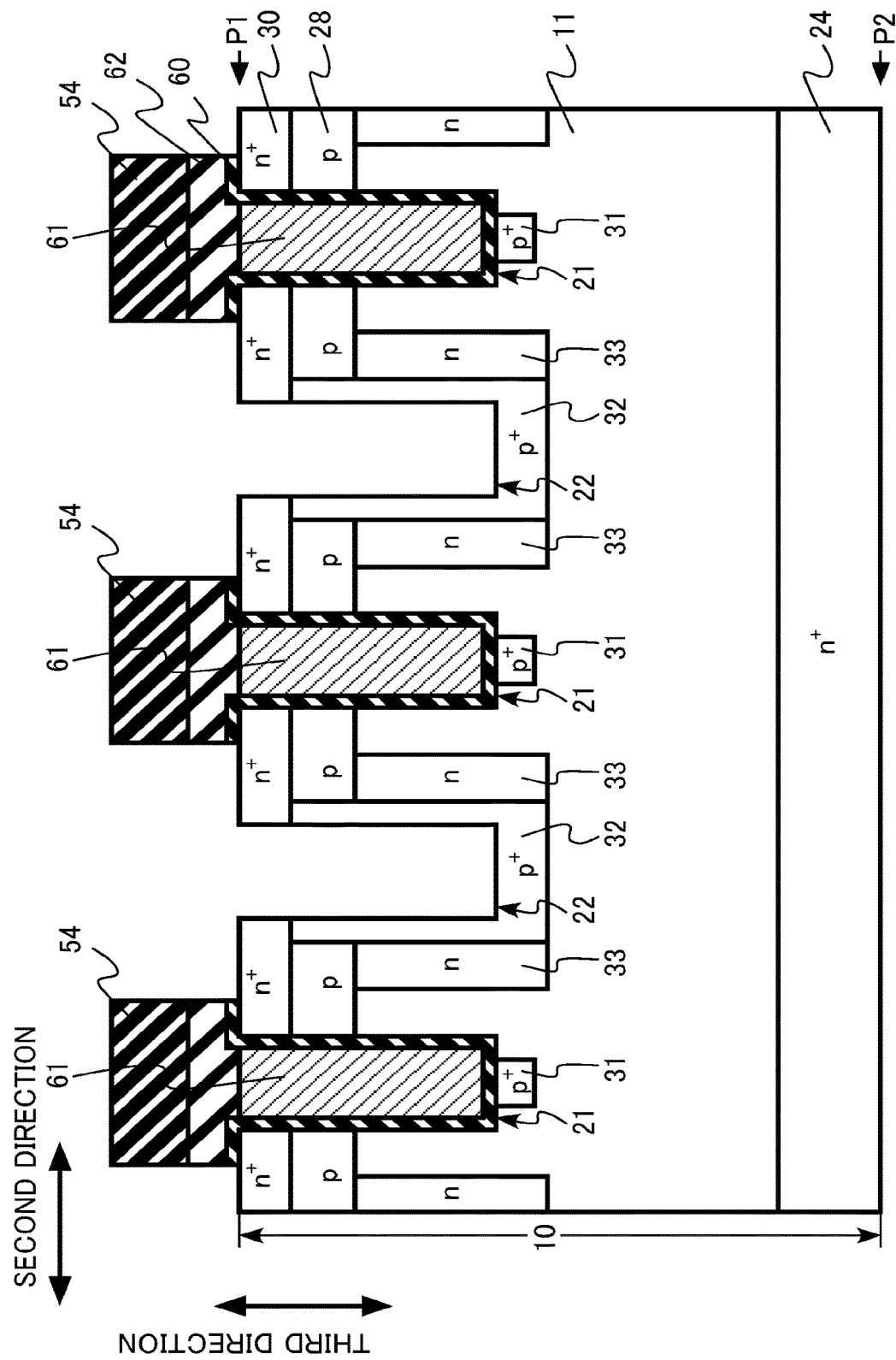
FIG. 17 is a schematic cross-sectional view showing an example of the method for manufacturing the semiconductor device according to the first embodiment.

Next, the first silicon oxide film 60 and the second silicon oxide film 62 in the contact trench 22 are removed using the mask material 54 as a mask (FIG. 17). The first silicon oxide film 60 and the second silicon oxide film 62 are removed by, for example, a wet etching method.

Figure 18:
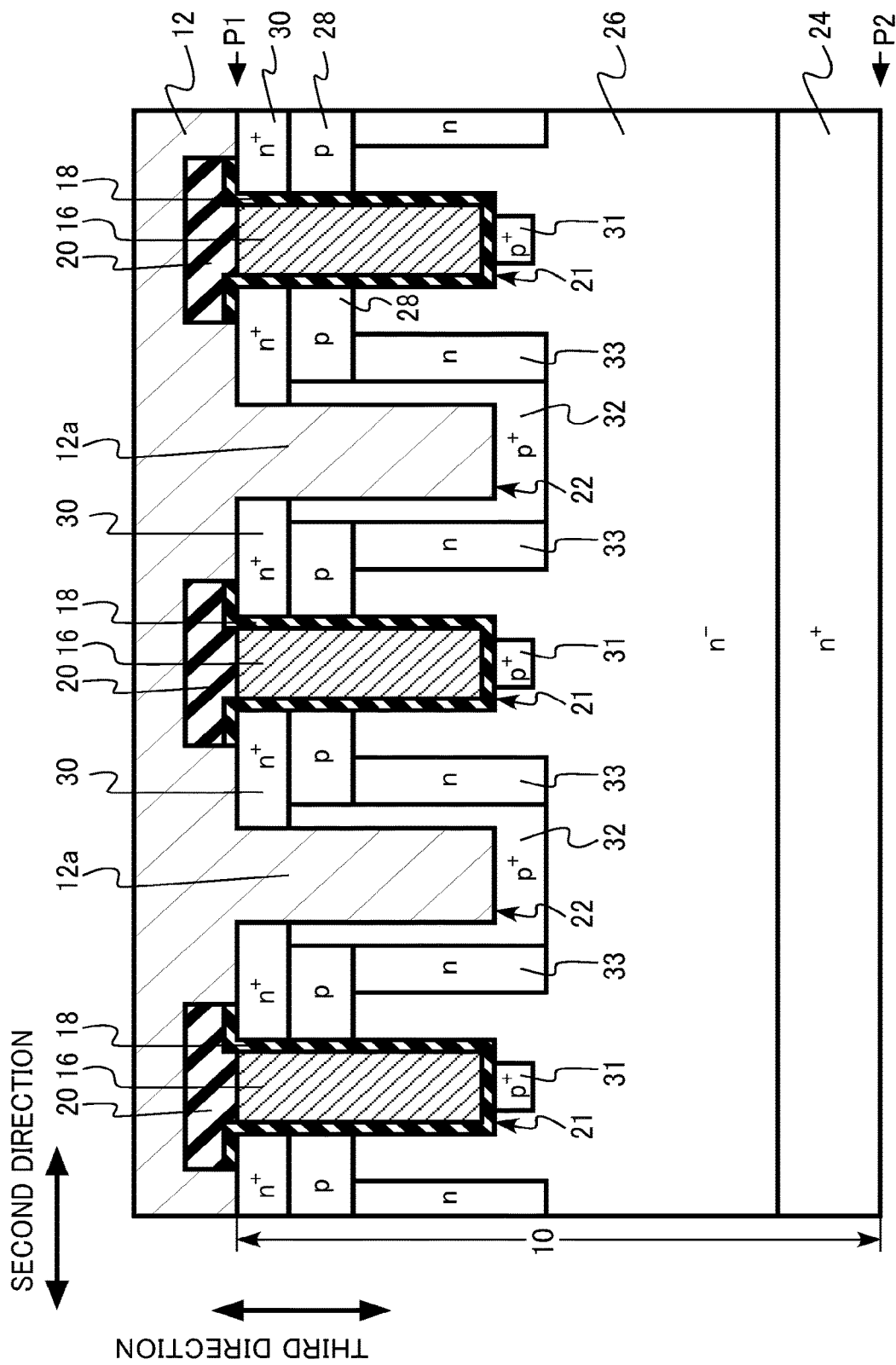
FIG. 18 is a schematic cross-sectional view showing an example of the method for manufacturing the semiconductor device according to the first embodiment.

Next, the mask material 54 is removed. Next, the source electrode 12 is formed in the contact trench 22 and on the second silicon oxide film 62 (FIG. 18). The source electrode 12 is formed by depositing a metal film by the CVD method, for example.

Then, the drain electrode 14 is formed on the back face of the silicon carbide layer 10 using known process technology.

By the above manufacturing method, the MOSFET 100 shown in FIGS. 1 and 2 is manufactured.

Next, functions and effects of the semiconductor device and the method for manufacturing the semiconductor device according to the first embodiment will be described.

In the MOSFET 100, the trench gate structure in which the gate electrode 16 is provided in the gate trench 21 is applied. By applying the trench gate structure, a channel area per unit area is increased, and the on-resistance of the MOSFET 100 is reduced.

Further, in the MOSFET 100, the contact region 12a to be a part of the source electrode 12 is provided in the contact trench 22. The MOSFET 100 is a MOSFET having a so-called double trench structure.

By providing the contact region 12a in the contact trench 22, electrical connection to the body region 28 and the source region 30 can be made on the side face of the contact trench 22. Therefore, a connection area of the source electrode 12 on the face of the silicon carbide layer 10 can be reduced. As a result, the channel area per unit area is increased, and the on-resistance of the MOSFET 100 is reduced.

Further, the MOSFET 100 includes the field relaxation region 32 around the bottom face and the side face of the contact trench 22. Therefore, when the MOSFET 100 is turned off, the field applied to the gate insulating layer 18 is alleviated. As a result, the reliability of the gate insulating layer 18 is improved.

Further, the MOSFET 100 includes the gate trench bottom region 31 at the bottom of the gate trench 21. Therefore, when the MOSFET 100 is turned off, the field applied to the gate insulating layer 18 is alleviated. As a result, the reliability of the gate insulating layer 18 is improved.

Figure 19:
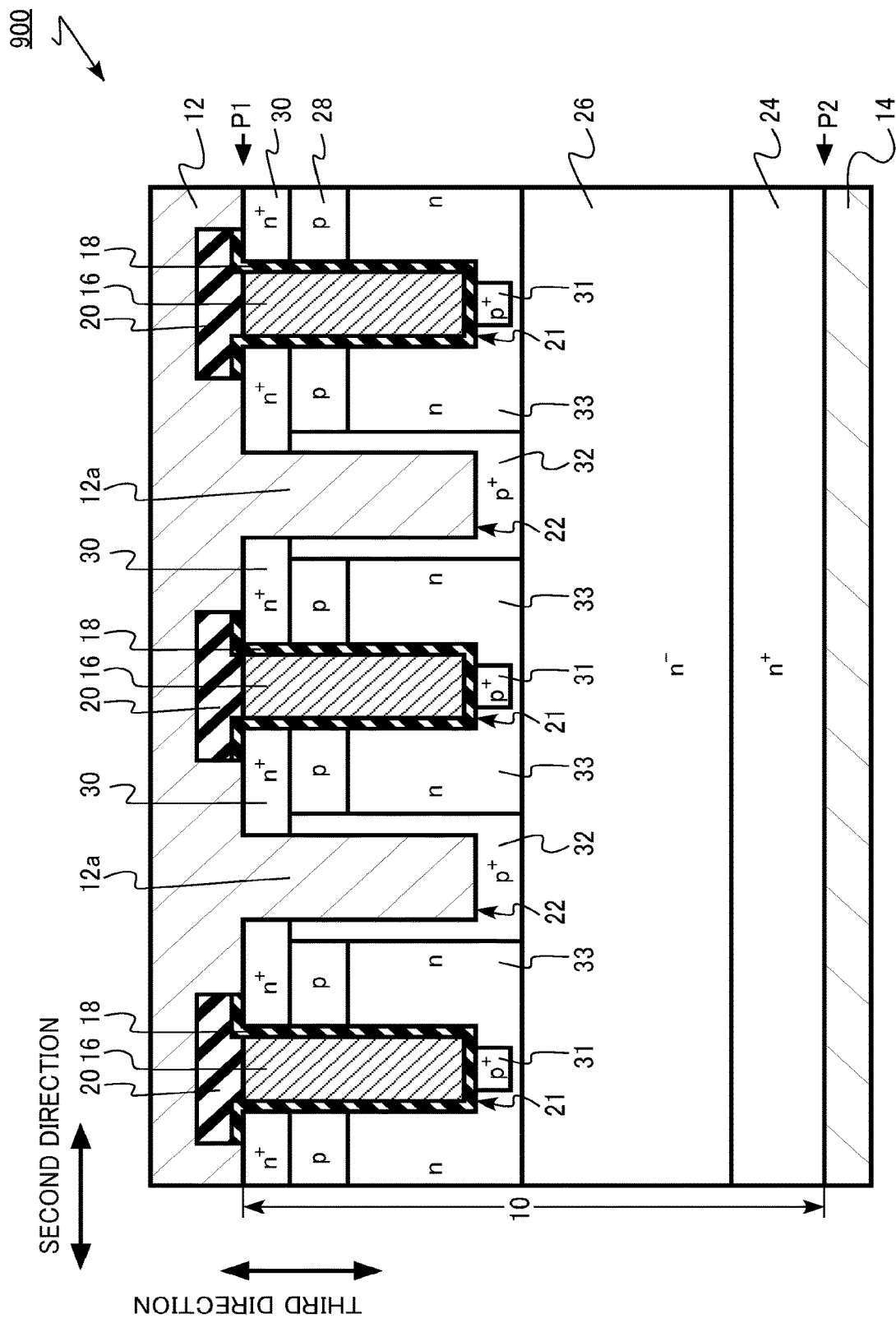
FIG. 19 is a schematic cross-sectional view of a semiconductor device according to a comparative example.

FIG. 19 is a schematic cross-sectional view of a semiconductor device according to a comparative example. The semiconductor device according to the comparative example is a MOSFET 900 having a double trench structure.

The MOSFET 900 according to the comparative example includes the n-type high concentration region 33 between the gate trench 21 and the contact trench 22. By including the high concentration region 33, electric resistance in the region between the gate trench 21 and the contact trench 22 is reduced. Therefore, the on-resistance of the MOSFET 900 is reduced.

The MOSFET 900 according to the comparative example is different from the MOSFET 100 according to the first embodiment in that the drift region 26 is not interposed between the n-type high concentration region 33 and the gate trench bottom region 31. In other words, the MOSFET 900 according to the comparative example is different from the MOSFET 100 according to the first embodiment in that the high concentration region 33 and the gate trench bottom region 31 are in contact with each other.

The gate trench bottom region 31 is formed by implanting p-type impurities under the gate trench 21 at a high concentration by ion implantation. For this reason, crystal defects exist at a high density in the gate trench bottom region 31.

A pn junction between the gate trench bottom region 31 and the high concentration region 33 becomes a steep junction because the high concentration region is in contact. For this reason, when the MOSFET 900 is turned off, the field strength of the pn junction increases, and a leak current due to the crystal defects increases. That is, an off-leak current of the MOSFET 900 increases.

In the MOSFET 100 according to the first embodiment, the drift region 26 is interposed between the n-type high concentration region 33 and the gate trench bottom region 31. In other words, the high concentration region 33 and the gate trench bottom region 31 are separated from each other. The pn junction between the gate trench bottom region 31 and the drift region 26 becomes a loose junction as compared with the case of the MOSFET 900, because the drift region 26 has a low n-type impurity concentration. Therefore, when the MOSFET 100 is turned off, the field strength of the pn junction is reduced, and the leak current due to the crystal defects is reduced. Therefore, the off-leak current of the MOSFET 100 can be reduced.

Unlike the MOSFET 900, in the MOSFET 100 according to the first embodiment, the high concentration region 33 is not in contact with the gate insulating layer 18. Therefore, the extension of the field extending from the side of the drift region 26 to the body region 28 is suppressed. As a result, a short channel effect is suppressed as compared with the MOSFET 900.

From the viewpoint of reducing the off-leak current and the on-resistance, the n-type impurity concentration of the high concentration region 33 is preferably $4 \times 10^{16}$ cm$^{-3}$ or more and $4 \times 10^{17}$ cm$^{-3}$ or less.

As described above, according to the first embodiment, a MOSFET capable of reducing the off-leak current can be realized.

(Second Embodiment)

A method for manufacturing a semiconductor device according to a second embodiment is different from a method for manufacturing a semiconductor device according to the first embodiment in that a first trench is formed after a third region is formed. Hereinafter, description of contents overlapping with those of the first embodiment will be partially omitted.

Hereinafter, an example of the method for manufacturing the semiconductor device according to the second embodiment will be described. The method for manufacturing the semiconductor device according to the second embodiment is a method for manufacturing a MOSFET 100 according to the first embodiment FIGS. 20 to 24 are schematic cross-sectional views showing an example of the method for manufacturing the semiconductor device according to the second embodiment. FIGS. 20 to 24 show cross-sections corresponding to FIG. 1.

The method for manufacturing the semiconductor device according to the second embodiment is the same as the method for manufacturing the semiconductor device according to the first embodiment until an n$^+$-type source region 30 is formed.

Next, a mask material 55 is formed on a face of a silicon carbide layer 10. The mask material 55 is formed by, for example, depositing a film by a CVD method, a lithography method, and patterning a film using a RIE method. The mask material 50 is, for example, a silicon oxide film.

Figure 20:
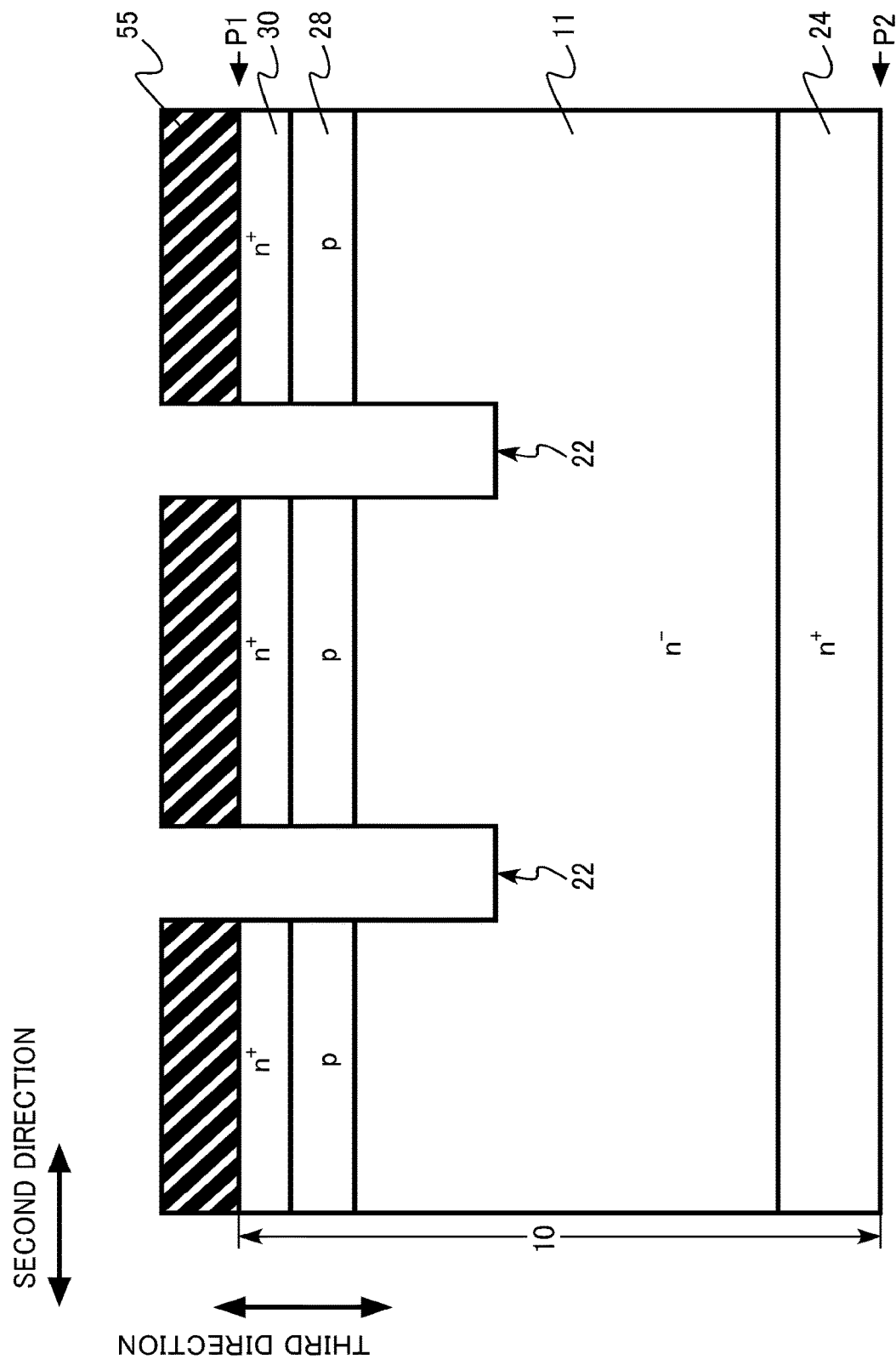
FIG. 20 is a schematic cross-sectional view showing an example of a method for manufacturing a semiconductor device according to a second embodiment.

Next, a contact trench 22 (second trench) is formed using the mask material 55 as a mask (FIG. 20). The contact trench 22 is formed by, for example, the RIE method.

Figure 21:
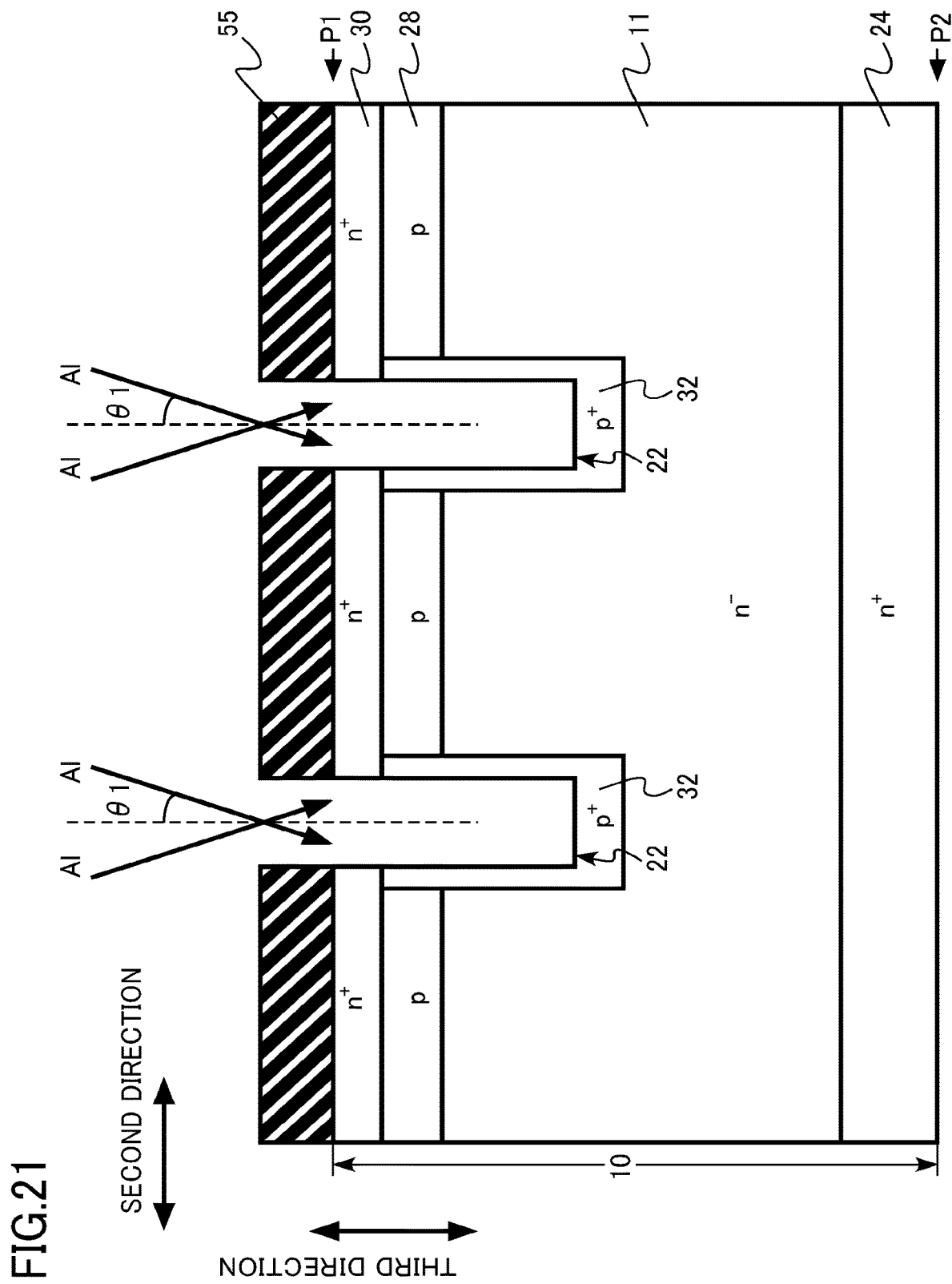
FIG. 21 is a schematic cross-sectional view showing an example of the method for manufacturing the semiconductor device according to the second embodiment.

Next, a p+-type field relaxation region 32 is formed (FIG. 21). The field relaxation region 32 is an example of the second region.

The field relaxation region 32 is formed by implanting p-type impurities into the contact trench 22 by an oblique ion implantation method using the mask material 55 as a mask. The p-type impurity is, for example, an aluminum ion. The aluminum ion is implanted in a direction inclined at a first angle (θ1 in FIG. 21) with respect to a normal (dotted line in FIG. 21) of a first plane P1. The p+-type field relaxation region 32 is formed in the vicinity of the side face and the bottom face of the contact trench 22 of the silicon carbide layer 10.

Figure 22:
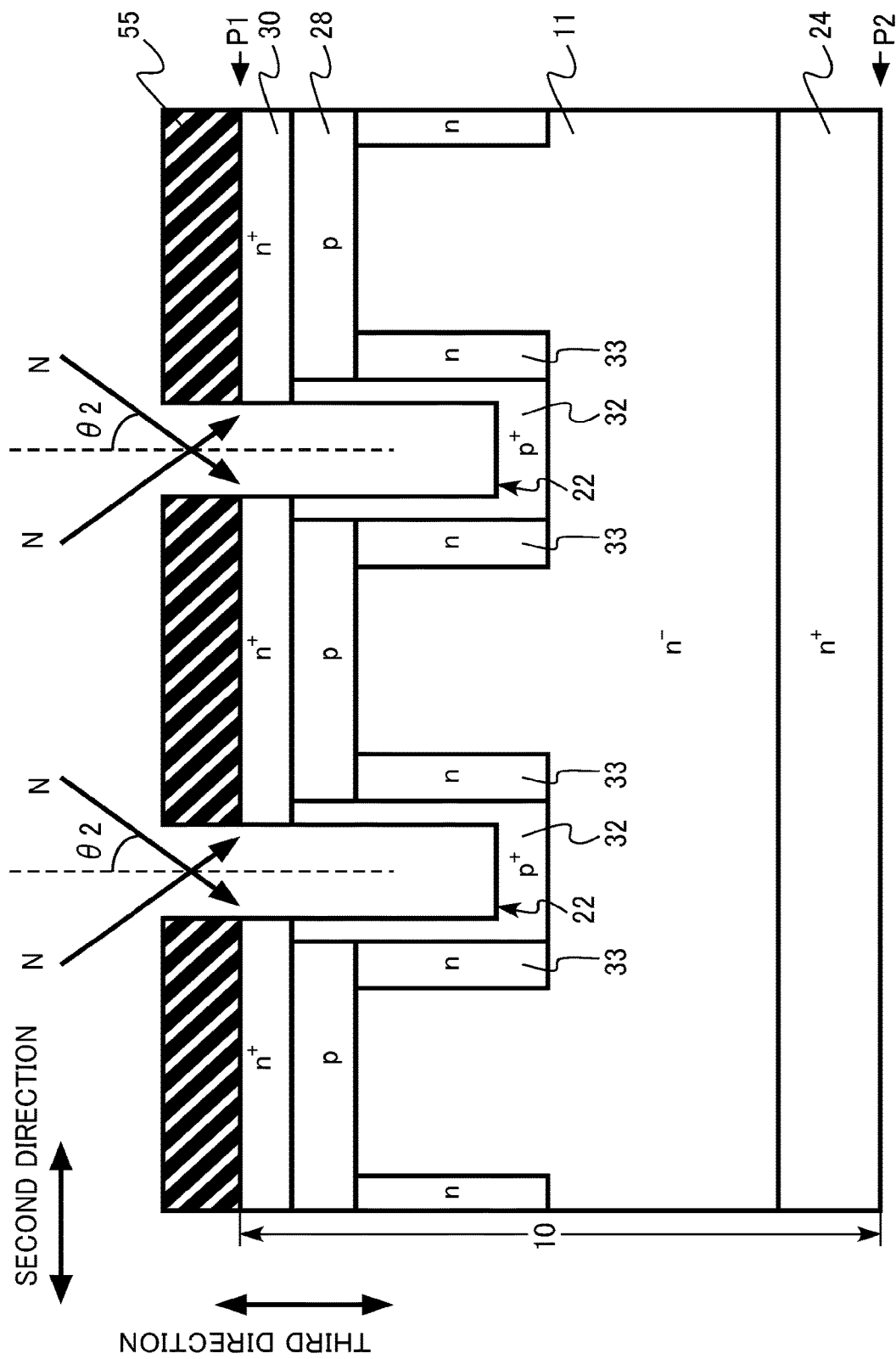
FIG. 22 is a schematic cross-sectional view showing an example of the method for manufacturing the semiconductor device according to the second embodiment.

Next, an n-type high concentration region 33 is formed (FIG. 22). The high concentration region 33 is an example of the third region. The high concentration region 33 is formed between the epitaxial layer 11 (first region) and the field relaxation region 32 (second region).

The high concentration region 33 is formed by implanting n-type impurities into the contact trench 22 by the oblique ion implantation method using the mask material 55 as a mask. The n-type impurity is, for example, a nitrogen ion. The nitrogen ion is implanted in a direction inclined at a second angle (θ2 in FIG. 22) with respect to a normal (dotted line in FIG. 22) of the first plane P1.

The second angle θ2 is larger than the first angle θ1, for example. In other words, the first angle θ1 is smaller than the second angle θ2, for example.

An accelerating voltage for ion implantation of the n-type impurity when the high concentration region 33 is formed is larger than an accelerating voltage for ion implantation for the p-type impurity when the field relaxation region 32 is formed, for example.

The n-type impurity concentration of the high concentration region 33 is higher than the n-type impurity concentration of the epitaxial layer 11.

Next, a mask material 56 is formed. The mask material 56 is, for example, a photoresist. The mask material 56 covers the contact trench 22.

Figure 23:
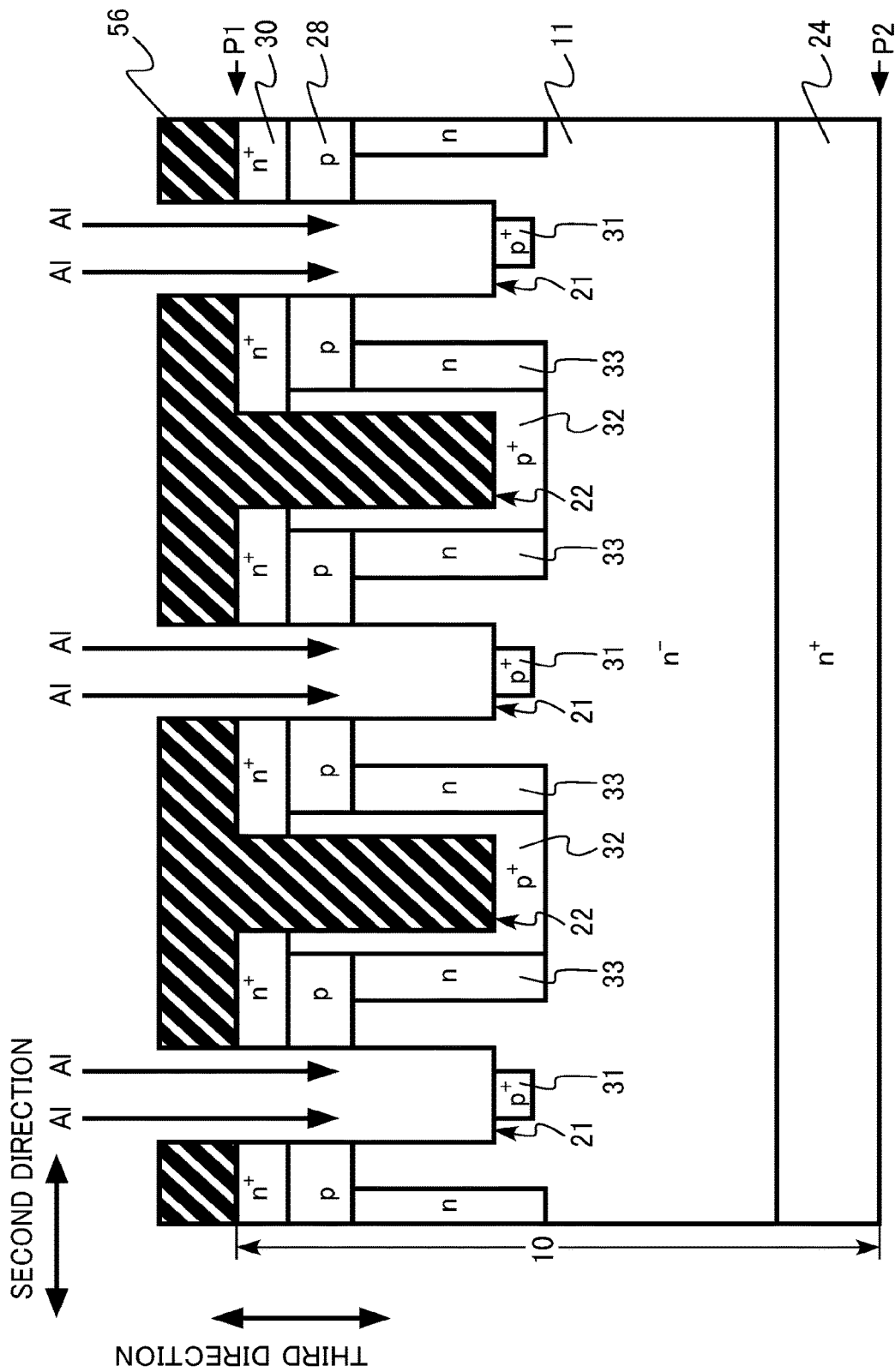
FIG. 23 is a schematic cross-sectional view showing an example of the method for manufacturing the semiconductor device according to the second embodiment.

Next, a p+-type gate trench bottom region 31 is formed (FIG. 23). The gate trench bottom region 31 is formed by implanting p-type impurities into the gate trench 21 by the ion implantation method using the mask material 56 as a mask. The p-type impurity is, for example, an aluminum ion.

Figure 24:
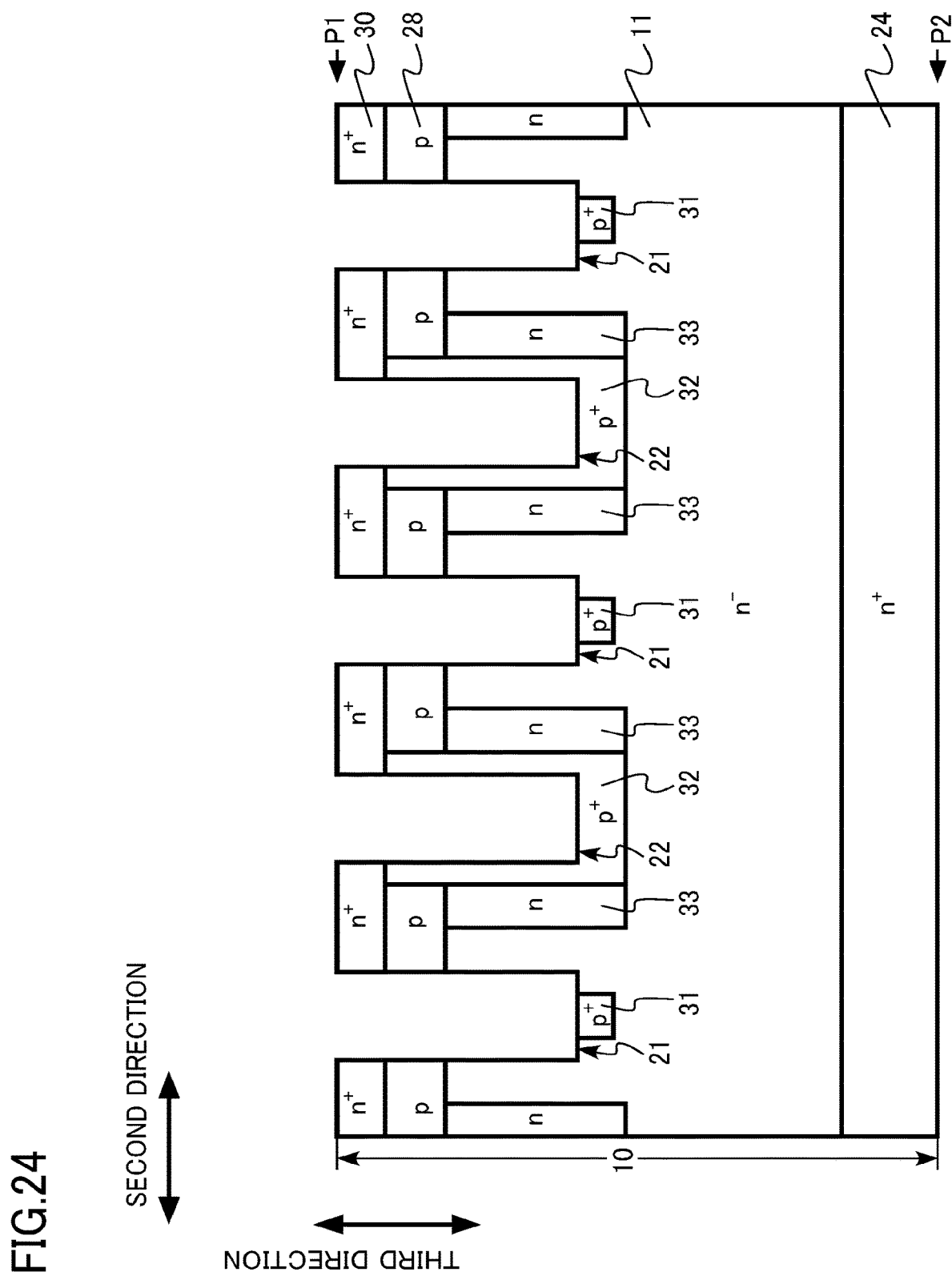
FIG. 24 is a schematic cross-sectional view showing an example of the method for manufacturing the semiconductor device according to the second embodiment.

Next, the mask material 56 is removed (FIG. 24). Then, the MOSFET 100 shown in FIGS. 1 and 2 is manufactured by the same manufacturing method as the method for manufacturing the semiconductor device according to the first embodiment.

In the method for manufacturing the semiconductor device according to the second embodiment, unlike the method for manufacturing the semiconductor device according to the first embodiment, the gate trench 21 and the contact trench 22 can be formed independently. Therefore, for example, it becomes easy to form the contact trench 22 having a depth or a taper 7 of the side face different from those of the gate trench 21.

As described above, according to the second embodiment, a MOSFET capable of reducing an off-leak current can be realized.

(Third Embodiment)

A semiconductor device according to a third embodiment is different from a semiconductor device according to the first embodiment in that a sixth silicon carbide region is in contact with a gate insulating layer. Hereinafter, description of contents overlapping with those of the first embodiment will be partially omitted.

The semiconductor device according to the third embodiment is a vertical MOSFET 200 using silicon carbide. The MOSFET 200 is a MOSFET having a trench gate structure in which a gate electrode is provided in a trench. Further, the MOSFET 200 is a MOSFET having so-called double trench structure in which a source electrode is provided in a trench. Further, the MOSFET 200 is an n-channel MOSFET using electrons as carriers.

Figure 25:
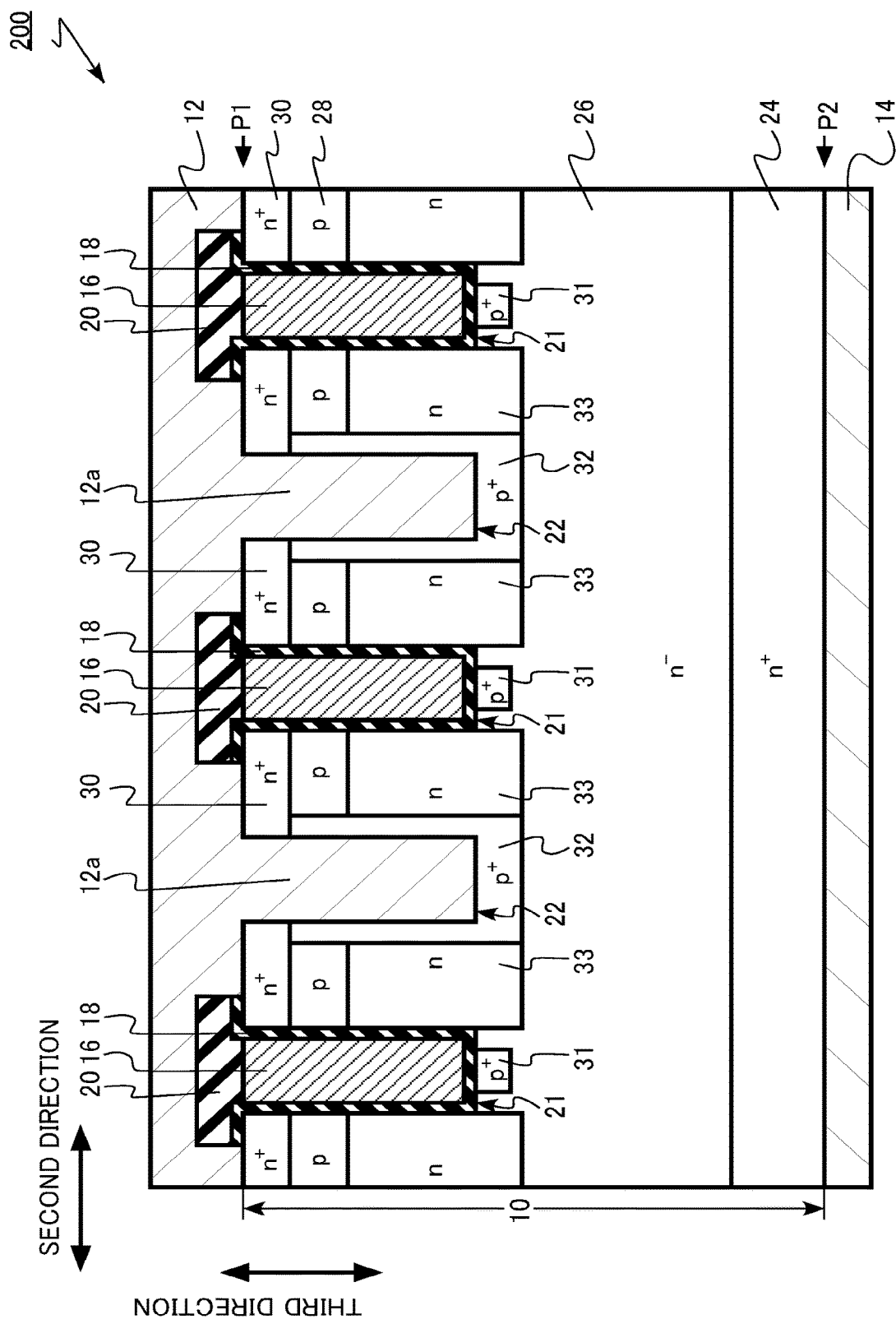
FIG. 25 is a schematic cross-sectional view of a semiconductor device according to a third embodiment.

FIG. 25 is a schematic cross-sectional view of the semiconductor device according to the third embodiment. FIG. 25 is a diagram corresponding to FIG. 1 showing the first embodiment.

The MOSFET 200 includes a silicon carbide layer 10, a source electrode 12 (first electrode), a drain electrode 14 (second electrode), a gate electrode 16, a gate insulating layer 18, and an interlayer insulating layer 20. The source electrode 12 has a contact region 12a.

The silicon carbide layer 10 has a gate trench 21 (first trench), a contact trench 22 (second trench), an n+-type drain region 24, n−-type drift region 26 (first silicon carbide region), a p-type body region 28 (second silicon carbide region), an n+-type source region 30 (third silicon carbide region), a p+-type gate trench bottom region 31 (fourth silicon carbide region), a p+-type field relaxation region 32 (fifth silicon carbide region), and an n-type high concentration region 33 (sixth silicon carbide region).

The n-type high concentration region 33 is in contact with the gate insulating layer 18.

The MOSFET 200 has a large area occupied by the high concentration region 33 between the gate trench 21 and the contact trench 22. Therefore, electric resistance in a region between the gate trench 21 and the contact trench 22 is further reduced. Therefore, on-resistance of the MOSFET 200 is reduced.

Figure 26:
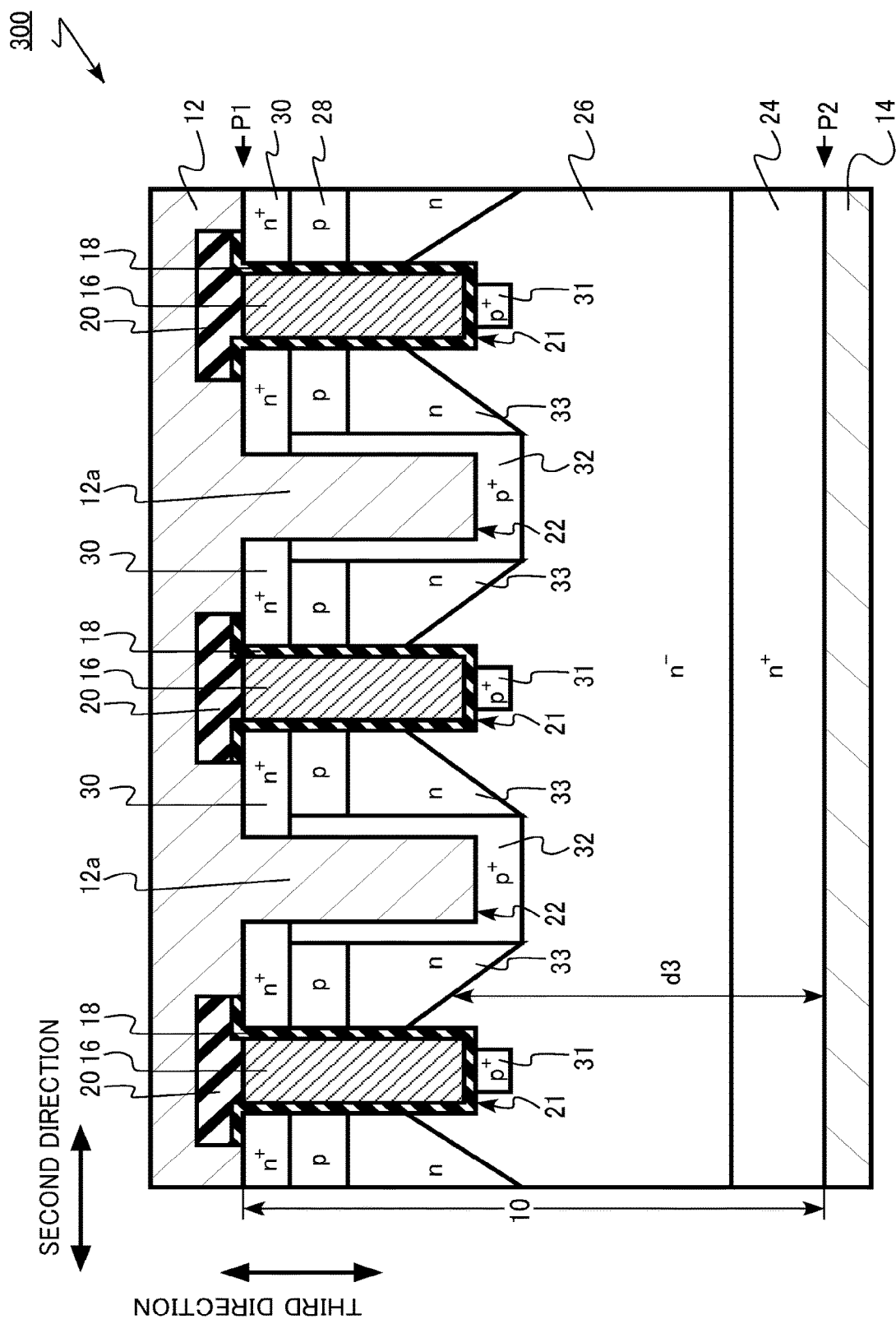
FIG. 26 is a schematic cross-sectional view of a semiconductor device according to a modification of the third embodiment.

FIG. 26 is a schematic cross-sectional view of a semiconductor device according to a modification of the third embodiment. FIG. 26 is a diagram corresponding to FIG. 1 showing the first embodiment.

In a MOSFET 300 according to the modification, a distance (d3 in FIG. 26) between a second plane P2 and the high concentration region 33 decreases from the gate insulating layer 18 toward the field relaxation region 32. In other words, the depth of the high concentration region 33 increases from the gate trench 21 toward the contact trench 22.

According to the MOSFET 300 according to the modification, the distance between the gate trench bottom region 31 and the high concentration region 33 is larger than that of the MOSFET 200. Therefore, for example, the possibility that the gate trench bottom region 31 and the high concentration region 33 are in contact with each other due to a process variation is reduced.

As described above, according to the third embodiment, a MOSFET capable of reducing an off-leak current can be realized. Further, a MOSFET capable of reducing on-resistance can be realized.

(Fourth Embodiment)

A semiconductor device according to a fourth embodiment is different from a semiconductor device according to the first embodiment in that a first silicon carbide region has a first portion and a second portion located between the first portion and a first plane, the second portion having a higher n-type impurity concentration than that of the first portion, and the second portion is located between a fourth silicon carbide region and a sixth silicon carbide region. Hereinafter, description of contents overlapping with those of the first embodiment will be partially omitted.

The semiconductor device according to the fourth embodiment is a vertical MOSFET 400 using silicon carbide. The MOSFET 400 is a MOSFET having a trench gate structure in which a gate electrode is provided in a trench. Further, the MOSFET 400 is a MOSFET having so-called double trench structure in which a source electrode is provided in a trench. Further, the MOSFET 400 is an n-channel MOSFET using electrons as carriers.

Figure 27:
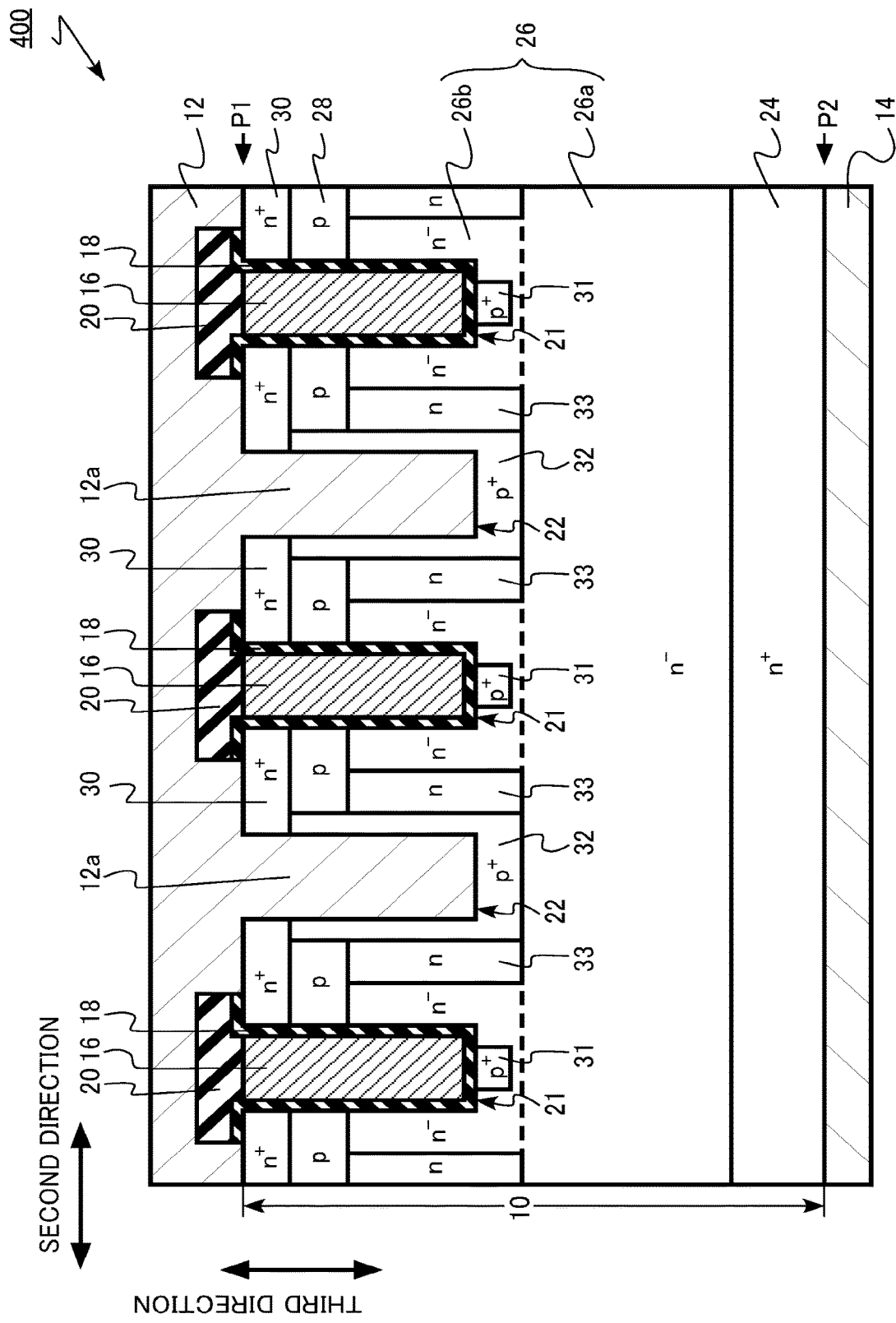
FIG. 27 is a schematic cross-sectional view of a semiconductor device according to a fourth embodiment.

FIG. 27 is a schematic cross-sectional view of the semiconductor device according to the fourth embodiment. FIG. 27 is a diagram corresponding to FIG. 1 showing the first embodiment.

The MOSFET 400 includes a silicon carbide layer 10, a source electrode 12 (first electrode), a drain electrode 14 (second electrode), a gate electrode 16, a gate insulating layer 18, and an interlayer insulating layer 20. The source electrode 12 has a contact region 12a.

The silicon carbide layer 10 has a gate trench 21 (first trench), a contact trench 22 (second trench), an n$^+$-type drain region 24, n$^-$-type drift region 26 (first silicon carbide region), a p-type body region 28 (second silicon carbide region), an n$^+$-type source region 30 (third silicon carbide region), a p$^+$-type gate trench bottom region 31 (fourth silicon carbide region), a p$^+$-type field relaxation region 32 (fifth silicon carbide region), and an n-type high concentration region 33 (sixth silicon carbide region). The drift region 26 has a first portion 26a and a second portion 26b.

The second portion 26b of the drift region 26 is located between the first portion 26a and a first plane P1. An n-type impurity concentration of the second portion 26b is higher than an n-type impurity concentration of the first portion 26a. The second portion 26b is located between the gate trench bottom region 31 and the high concentration region 33.

The n-type impurity concentration of the second portion 26b is lower than the n-type impurity concentration of the high concentration region 33.

The MOSFET 400 has a high n-type impurity concentration between the gate trench bottom region 31 and the field relaxation region 32. Therefore, on-resistance of the MOSFET 400 is reduced.

As described above, according to the fourth embodiment, a MOSFET capable of reducing an off-leak current can be realized. Further, a MOSFET capable of reducing on-resistance can be realized.

(Fifth Embodiment)

A semiconductor device according to a fifth embodiment is different from a semiconductor device according to the first embodiment in that a distance from a second plane to a sixth silicon carbide region is smaller than a distance from the second plane to a fifth silicon carbide region. Hereinafter, description of contents overlapping with those of the first embodiment will be partially omitted.

The semiconductor device according to the fifth embodiment is a vertical MOSFET 500 using silicon carbide. The MOSFET 500 is a MOSFET having a trench gate structure in which a gate electrode is provided in a trench. Further, the MOSFET 500 is a MOSFET having so-called double trench structure in which a source electrode is provided in a trench. Further, the MOSFET 500 is an n-channel MOSFET using electrons as carriers.

Figure 28:
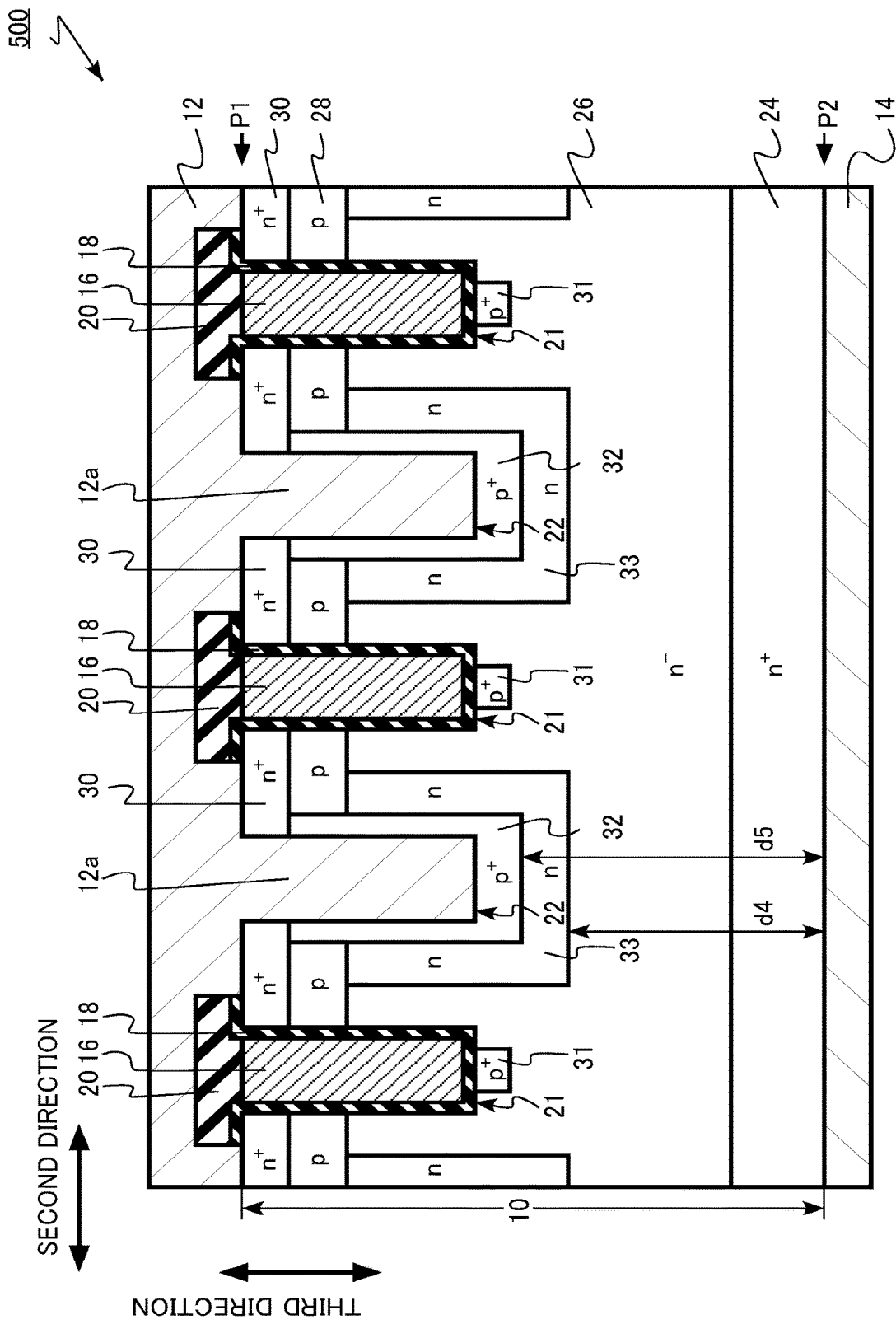
FIG. 28 is a schematic cross-sectional view of a semiconductor device according to a fifth embodiment.

FIG. 28 is a schematic cross-sectional view of the semiconductor device according to the fifth embodiment. FIG. 28 is a diagram corresponding to FIG. 1 showing the first embodiment.

The MOSFET 500 includes a silicon carbide layer 10, a source electrode 12 (first electrode), a drain electrode 14 (second electrode), a gate electrode 16, a gate insulating layer 18, and an interlayer insulating layer 20. The source electrode 12 has a contact region 12a.

The silicon carbide layer 10 has a gate trench 21 (first trench), a contact trench 22 (second trench), an n$^+$-type drain region 24, n$^-$-type drift region 26 (first silicon carbide region), a p-type body region 28 (second silicon carbide region), an n$^+$-type source region 30 (third silicon carbide region), a p$^+$-type gate trench bottom region 31 (fourth silicon carbide region), a p$^+$-type field relaxation region 32 (fifth silicon carbide region), and an n-type high concentration region 33 (sixth silicon carbide region).

A distance (d4 in FIG. 28) from a second plane P2 to the high concentration region 33 is smaller than a distance (d5 in FIG. 28) from the second plane P2 to the field relaxation region 32. In other words, the depth of the high concentration region 33 is larger than the depth of the field relaxation region 32. The high concentration region 33 covers the field relaxation region 32, for example.

The MOSFET 500 has a high n-type impurity concentration under the contact trench 22. Therefore, on-resistance of the MOSFET 500 is reduced.

As described above, according to the fifth embodiment, a MOSFET capable of reducing an off-leak current can be realized. Further, a MOSFET capable of reducing on-resistance can be realized.

(Sixth Embodiment)

A semiconductor device according to a sixth embodiment is different from a semiconductor device according to the first embodiment in that a silicon carbide layer does not have a second trench. Hereinafter, description of contents overlapping with those of the first embodiment will be partially omitted.

The semiconductor device according to the sixth embodiment is a vertical MOSFET 600 using silicon carbide. The MOSFET 600 is a MOSFET having a trench gate structure in which a gate electrode is provided in a trench. Further, the MOSFET 600 is an n-channel MOSFET using electrons as carriers.

Figure 29:
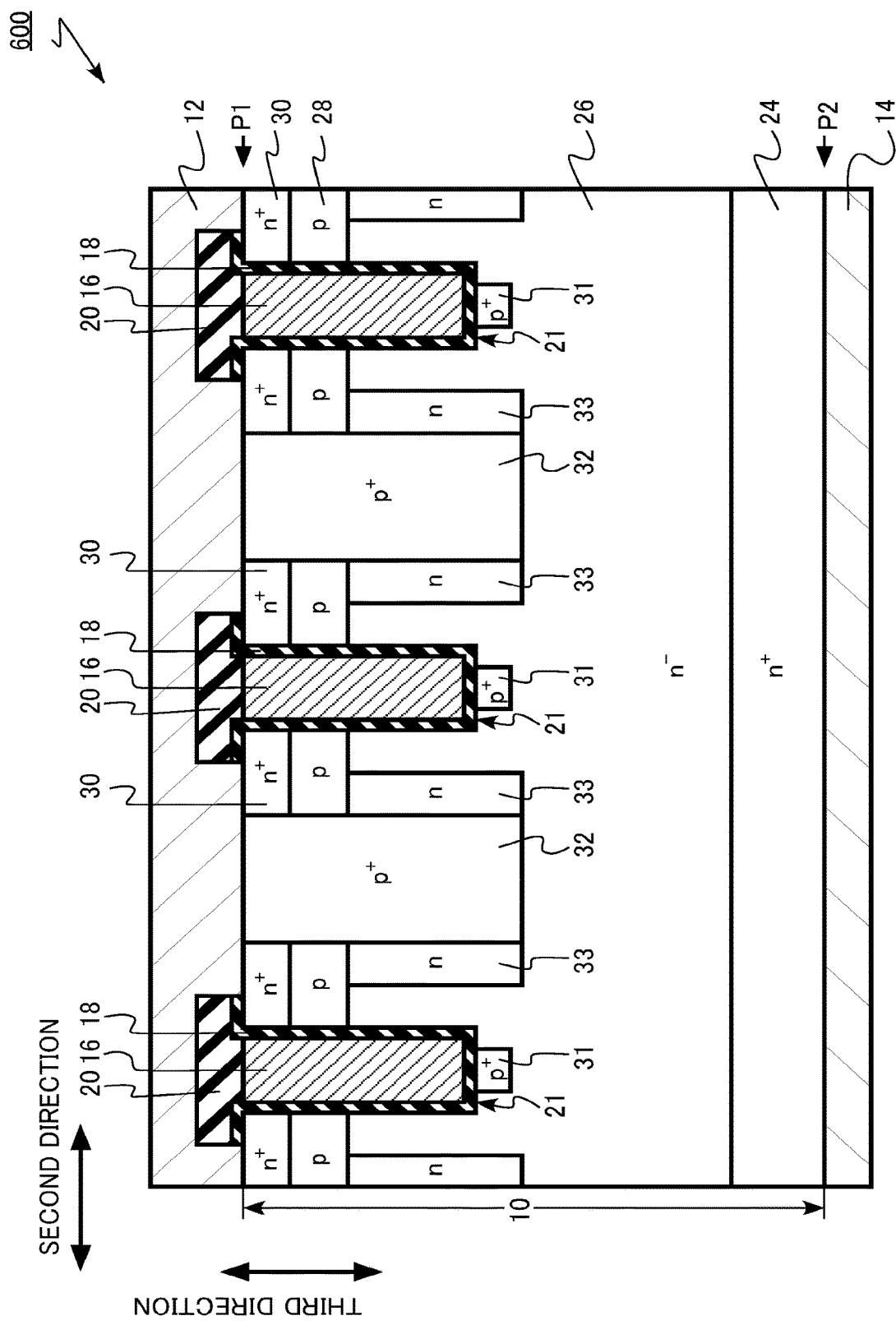
FIG. 29 is a schematic cross-sectional view of a semiconductor device according to a sixth embodiment.

FIG. 29 is a schematic cross-sectional view of the semiconductor device according to the sixth embodiment. FIG. 29 is a diagram corresponding to FIG. 1 showing the first embodiment.

The MOSFET 600 includes a silicon carbide layer 10, a source electrode 12 (first electrode), a drain electrode 14 (second electrode), a gate electrode 16, a gate insulating layer 18, and an interlayer insulating layer 20.

The silicon carbide layer 10 has a gate trench 21 (first trench), an n$^+$-type drain region 24, n$^-$-type drift region 26 (first silicon carbide region), a p-type body region 28 (second silicon carbide region), an n$^+$-type source region 30 (third silicon carbide region), a p$^+$-type gate trench bottom region 31 (fourth silicon carbide region), a p$^+$-type field relaxation region 32 (fifth silicon carbide region),and an n-type high concentration region 33 (sixth silicon carbide region).

The source electrode 12 is in contact with the field relaxation region 32 on a first plane P1.

As described above, according to the sixth embodiment, a MOSFET capable of reducing an off-leak current can be realized.

(Seventh Embodiment)

A drive device according to a seventh embodiment is a drive device including a semiconductor device according to the first embodiment.

Figure 30:
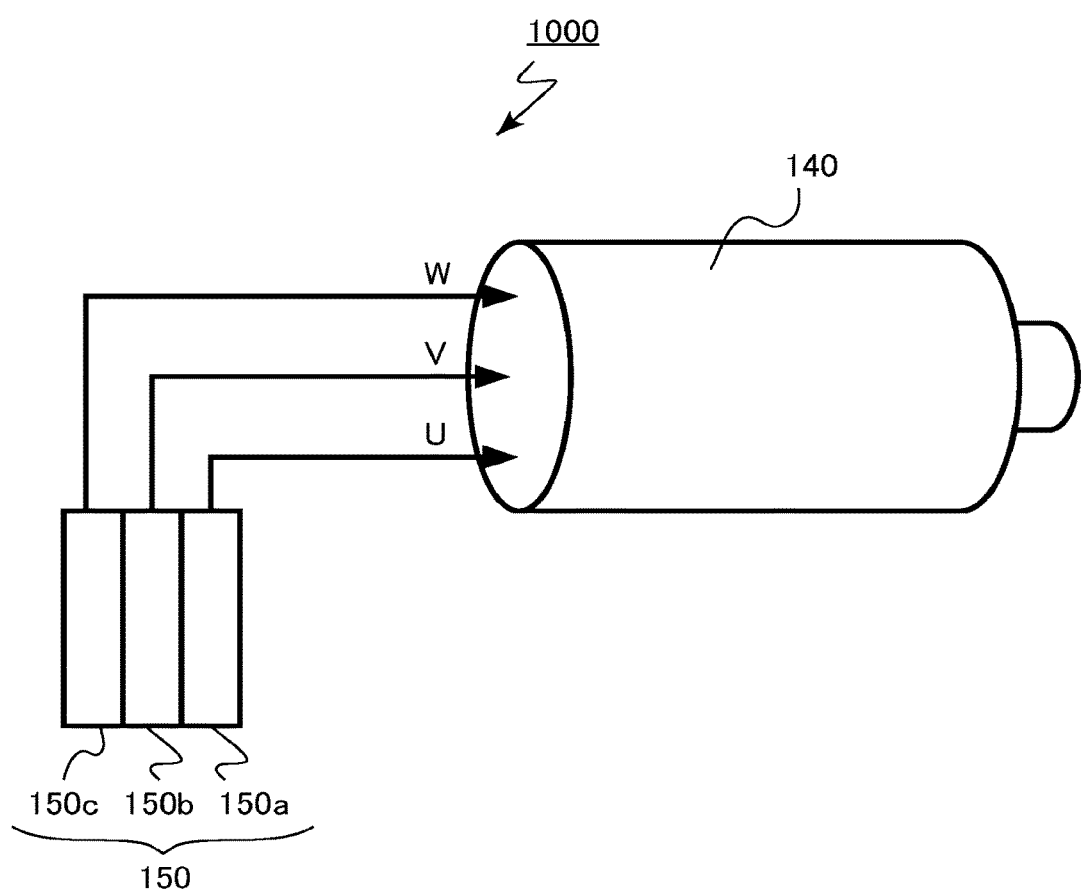
FIG. 30 is a schematic diagram of a drive device according to a seventh embodiment.

FIG. 30 is a schematic diagram of the drive device according to the seventh embodiment. A drive device 1000 includes a motor 140 and an inverter circuit 150.

The inverter circuit 150 includes three semiconductor modules 150a, 150b, and 150c using a MOSFET 100 according to the first embodiment as a switching element. By connecting the three semiconductor modules 150a, 150b, and 150c in parallel, the three-phase inverter circuit 150 having three AC voltage output terminals U, V, and W is realized. The motor 140 is driven by an AC voltage output from the inverter circuit 150.

According to the seventh embodiment, characteristics of the inverter circuit 150 and the drive device 1000 are improved by including the MOSFET 100 having improved characteristics.

(Eighth Embodiment)

A vehicle according to an eighth embodiment is a vehicle including a semiconductor device according to the first embodiment.

Figure 31:
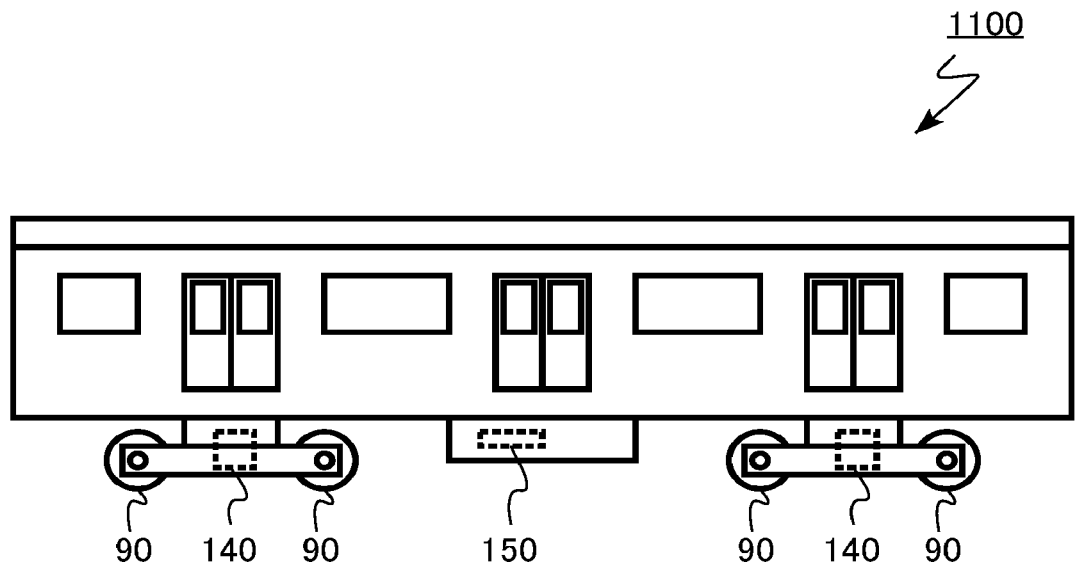
FIG. 31 is a schematic diagram of a vehicle according to an eighth embodiment.

FIG. 31 is a schematic diagram of the vehicle according to the eighth embodiment. A vehicle 1100 according to the eighth embodiment is a railroad vehicle. The vehicle 1100 includes motors 140 and an inverter circuit 150.

The inverter circuit 150 includes three semiconductor modules using a MOSFET 100 according to the first embodiment as a switching element. By connecting the three semiconductor modules in parallel, the three-phase inverter circuit 150 having three AC voltage output terminals U, V, and W is realized. The motor 140 is driven by an AC voltage output from the inverter circuit 150. Wheels 90 of the vehicle 1100 are rotated by the motor 140.

According to the eighth embodiment, characteristics of the vehicle 1100 are improved by including the MOSFET 100 having improved characteristics.

(Ninth Embodiment)

A vehicle according to a ninth embodiment is a vehicle including a semiconductor device according to the first embodiment.

Figure 32:
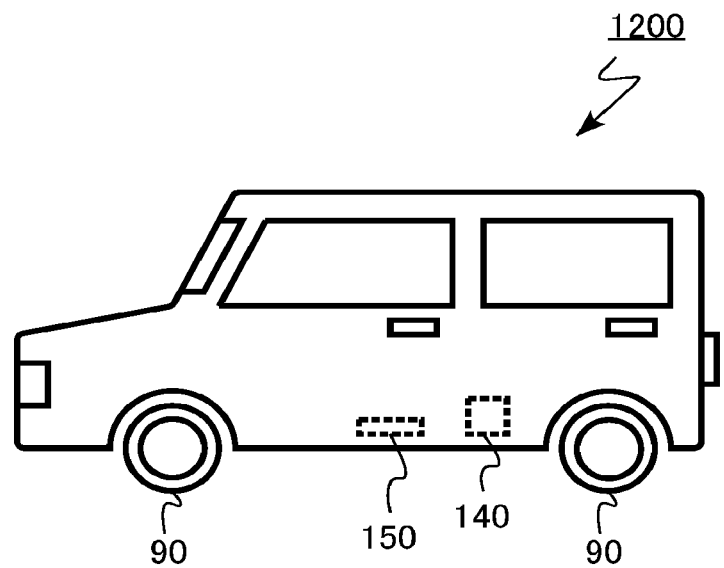
FIG. 32 is a schematic diagram of a vehicle according to a ninth embodiment.

FIG. 32 is a schematic diagram of the vehicle according to the ninth embodiment. A vehicle 1200 according to the ninth embodiment is an automobile. The vehicle 1200 includes a motor 140 and an inverter circuit 150.

The inverter circuit 150 includes three semiconductor modules using a MOSFET 100 according to the first embodiment as a switching element. By connecting the three semiconductor modules in parallel, the three-phase inverter circuit 150 having three AC voltage output terminals U, V, and W is realized.

The motor 140 is driven by an AC voltage output from the inverter circuit 150. Wheels 90 of the vehicle 1200 are rotated by the motor 140.

According to the ninth embodiment, characteristics of the vehicle 1200 are improved by including the MOSFET 100 having improved characteristics.

(Tenth Embodiment)

An elevator according to a tenth embodiment is an elevator including a semiconductor device according to the first embodiment.

Figure 33:
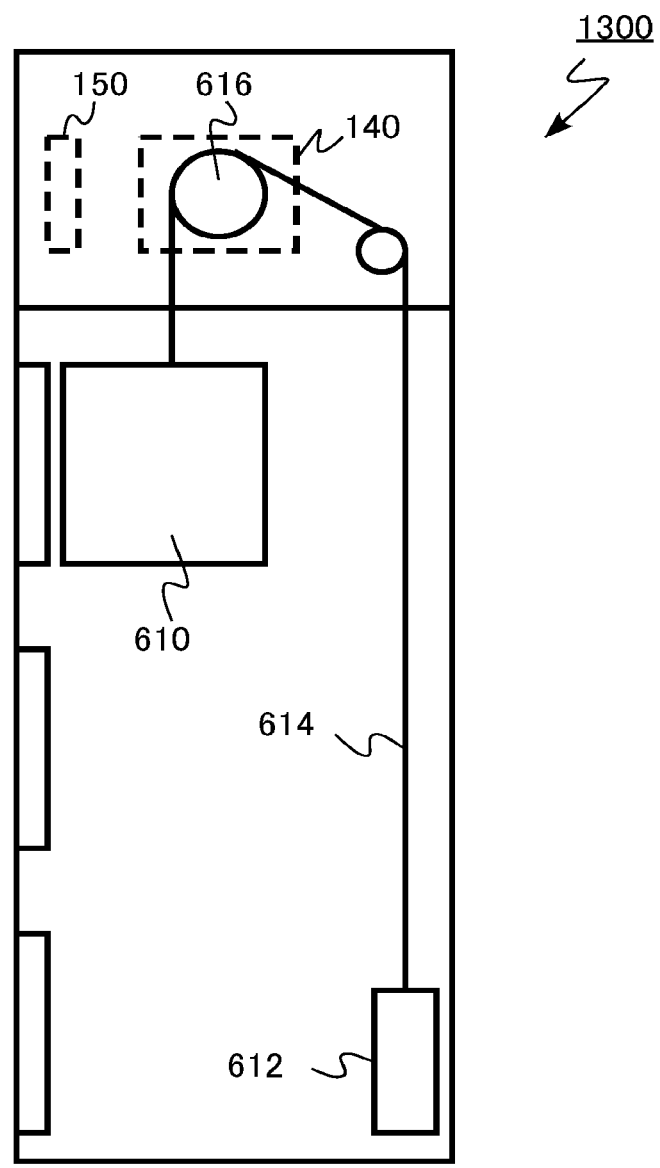
FIG. 33 is a schematic diagram of an elevator according to a tenth embodiment.

FIG. 33 is a schematic diagram of the elevator according to the tenth embodiment. An elevator 1300 according to the tenth embodiment includes a car 610, a counter weight 612, a wire rope 614, a winding machine 616, a motor 140, and an inverter circuit 150.

The inverter circuit 150 includes three semiconductor modules using a MOSFET 100 according to the first embodiment as a switching element. By connecting the three semiconductor modules in parallel, the three-phase inverter circuit 150 having three AC voltage output terminals U, V, and W is realized.

The motor 140 is driven by an AC voltage output from the inverter circuit 150. The winding machine 616 is rotated by the motor 140 and the car 610 is elevated.

According to the tenth embodiment, characteristics of the elevator 1300 are improved by including the MOSFET 100 having improved characteristics.

In the first to sixth embodiments described above, the case where 4H—SiC is used as a crystal structure of silicon carbide has been described as an example. However, the present disclosure can be applied to silicon carbide of other crystal structure such as 6H—SiC and 3C—SiC.

Further, in the seventh to tenth embodiments, the case where the semiconductor device according to the first embodiment is included has been described as an example. However, the semiconductor device according to any one of the third to sixth embodiments can be applied.

Further, in the seventh to tenth embodiments, the case where the semiconductor device according to the present disclosure is applied to the vehicle or the elevator has been described as an example. However, the semiconductor device according to the present disclosure can be applied to a power conditioner of a photovoltaic power generation system and the like.

While certain embodiments have been described, these embodiments have been presented by way of example only, and are not intended to limit the scope of the inventions. Indeed, the semiconductor device, the method for manufacturing the semiconductor device, the inverter circuit, the drive device, the vehicle, and the elevator described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a silicon carbide layer having a first plane parallel to a first direction and a second direction orthogonal to the first direction, and a second plane facing the first plane, the silicon carbide layer including
a first trench located on a side of the first plane, the first trench extending in the first direction,
a first silicon carbide region of n-type,
a second silicon carbide region of p-type located between the first silicon carbide region and the first plane,
a third silicon carbide region of n-type located between the second silicon carbide region and the first plane,
a fourth silicon carbide region of p-type located between the first silicon carbide region and the first trench, the fourth silicon carbide region having a p-type impurity concentration higher than a p-type impurity concentration of the second silicon carbide region,
a fifth silicon carbide region of p-type located between the first silicon carbide region and the first plane, the fifth silicon carbide region having a distance from the second plane smaller than a distance between the second plane and the first trench, and the fifth silicon carbide region having a p-type impurity concentration higher than the p-type impurity concentration of the second silicon carbide region, and a sixth silicon carbide region of n-type located between the fourth silicon carbide region and the fifth silicon carbide region, the first silicon carbide region being interposed between the sixth silicon carbide region the fourth silicon carbide region, and the sixth silicon carbide region having an n-type impurity concentration higher than an n-type impurity concentration of the first silicon carbide region;

a gate electrode located in the first trench;

a gate insulating layer located between the gate electrode and the silicon carbide layer;

a first electrode located on the side of the first plane of the silicon carbide layer; and a second electrode located on a side of the second plane of the silicon carbide layer.

2. The semiconductor device according to claim 1, further comprising: a second trench located on the side of the first plane, the second trench extending in the first direction, wherein a part of the first electrode is located in the second trench, and the fifth silicon carbide region is located between the first silicon carbide region and the second trench.

3. The semiconductor device according to claim 1, wherein the sixth silicon carbide region is in contact with the gate insulating layer.

4. The semiconductor device according to claim 3, wherein a distance between the second plane and the sixth silicon carbide region decreases from the gate insulating layer toward the fifth silicon carbide region.

5. The semiconductor device according to claim 1, wherein the first silicon carbide region has a first portion and a second portion located between the first portion and the first plane, the second portion having an n-type impurity concentration higher than n-type impurity concentration of the first portion, and the second portion is located between the fourth silicon carbide region and the sixth silicon carbide region.

6. The semiconductor device according to claim 1, wherein a distance from the second plane to the sixth silicon carbide region is smaller than a distance from the second plane to the fifth silicon carbide region.

7. An inverter circuit comprising the semiconductor device according to claim 1.

8. A drive device comprising the semiconductor device according to claim 1.

9. A vehicle comprising the semiconductor device according to claim 1.

10. An elevator comprising the semiconductor device according to claim 1.

11. A method for manufacturing a semiconductor device, the method comprising:

forming a first trench on a side of a first plane of a silicon carbide layer having the first plane, a second plane facing the first plane, and an n-type first region located between the second plane and the first plane;

forming a second trench on the side of the first plane of the silicon carbide layer;

ion-implanting a p-type impurity into the second trench in a direction inclined at a first angle with respect to a normal of the first plane and forming a p-type second region;

ion-implanting an n-type impurity into the second trench in a direction inclined at a second angle with respect to the normal of the first plane and forming an n-type third region having an n-type impurity concentration higher than an n-type impurity concentration of the n-type first region between the n-type first region and the p-type second region;

forming a gate insulating layer in the first trench; and forming a gate electrode on the gate insulating layer in the first trench.

12. The method for manufacturing a semiconductor device according to claim 11, wherein the first trench is formed after the third region is formed.

13. The method for manufacturing a semiconductor device according to claim 11, wherein the second angle is larger than the first angle.

14. The method for manufacturing a semiconductor device according to claim 11, wherein an accelerating voltage when the n-type impurity is ion-implanted is larger than an accelerating voltage when the p-type impurity is ion-implanted.

* * * * *